US012593481B2

(12) United States Patent
Joshi et al.

(10) Patent No.: US 12,593,481 B2
(45) Date of Patent: Mar. 31, 2026

(54) SILICON CARBIDE DEVICE WITH METALLIC INTERFACE LAYERS AND METHOD OF MANUFACTURING

(71) Applicant: Infineon Technologies AG, Neubiberg (DE)

(72) Inventors: Ravi Keshav Joshi, Klagenfurt am Wörthersee (AT); Thomas Ralf Siemieniec, Villach (AT); Werner Schustereder, Villach (AT); Kristijan Luka Mletschnig, Klagenfurt (AT); Axel König, Villach (AT)

(73) Assignee: Infineon Technologies AG, Neubiberg (DE)

( * ) Notice: Subject to any disclaimer, the term of this patent is extended or adjusted under 35 U.S.C. 154(b) by 505 days.

(21) Appl. No.: 18/100,144

(22) Filed: Jan. 23, 2023

(65) Prior Publication Data

US 2023/0253454 A1     Aug. 10, 2023

(30) Foreign Application Priority Data

Feb. 9, 2022    (EP) ..................................... 22155913

(51) Int. Cl.
    *H10D 62/13*        (2025.01)
    *H01L 21/04*        (2006.01)
    (Continued)

(52) U.S. Cl.
    CPC ....... *H10D 62/155* (2025.01); *H01L 21/0475* (2013.01); *H01L 21/0485* (2013.01);
    (Continued)

(58) Field of Classification Search
    CPC ............. H10D 30/0295; H10D 64/256; H10D 64/2565; H10D 84/119; H10D 8/60; H10D 8/605
    See application file for complete search history.

(56) References Cited

U.S. PATENT DOCUMENTS 9,293,558 B2    3/2016   Siemieniec et al.
9,478,655 B2    10/2016  Siemieniec et al.
(Continued)

FOREIGN PATENT DOCUMENTS

JP      2015126080 A    7/2015
WO      2008035822 A1   3/2008

OTHER PUBLICATIONS

P-Type 4H and 6H-SiC High-Voltage Schottky Barrier Diodes, R. Raghunathan and B. J. Baliga, IEEE Electron Device Letters, vol. 19, No. 3, Mar. 1998 (Year: 1998).*
(Continued)

*Primary Examiner* — Eric A. Ward
(74) *Attorney, Agent, or Firm* — Murphy, Bilak & Homiller, PLLC

(57)                    ABSTRACT
A method of manufacturing a semiconductor device includes forming a trench that extends from a first surface into a silicon carbide body. A first doped region and an oppositely doped second doped region are formed in the silicon carbide body. A lower layer structure is formed on a lower sidewall portion of the trench. An upper layer stack is formed on an upper sidewall portion and/or on the first surface. The first doped region and the upper layer stack are in direct contact along the upper sidewall portion and/or on the first surface. The second doped region and the lower layer structure are in direct contact along the lower sidewall portion.

15 Claims, 19 Drawing Sheets

(51) Int. Cl.

| | |
|---|---|
| *H10D 12/01* | (2025.01) |
| *H10D 30/66* | (2025.01) |
| *H10D 62/832* | (2025.01) |
| *H10D 64/23* | (2025.01) |
| *H10D 64/62* | (2025.01) |

(52) U.S. Cl.

CPC ......... *H10D 12/031* (2025.01); *H10D 30/668* (2025.01); *H10D 62/8325* (2025.01); *H10D 64/252* (2025.01); *H10D 64/62* (2025.01)

(56) References Cited

U.S. PATENT DOCUMENTS

| | | | |
|---|---|---|---|
| 11,043,560 B2 | 6/2021 | Siemieniec et al. | |
| 2014/0001489 A1* | 1/2014 | Yen ........................ | H10D 8/605 |
| | | | 257/77 |

| | | | |
|---|---|---|---|
| 2015/0249133 A1 | 9/2015 | Yanase et al. | |
| 2020/0321477 A1* | 10/2020 | Ren ........................ | H10D 8/051 |
| 2021/0249534 A1 | 8/2021 | Neumann et al. | |
| 2023/0107762 A1* | 4/2023 | Saito .................... | H10D 64/256 |
| | | | 257/77 |
| 2023/0215943 A1* | 7/2023 | Yang ................ | H01L 21/76877 |
| | | | 257/330 |
| 2023/0246077 A1* | 8/2023 | Baba .................... | H10D 62/157 |
| | | | 257/77 |

OTHER PUBLICATIONS

Rapid Thermal Processing Science and Technology, 4 Thin-Film Deposition, Mehmet C. Ozturk (Year: 1993).*

Wenzel, Roland, et al., "Diffusion barriers on titanium-based ohmic contact structures on SiC", IEEE, Electronic Materials, Technical University Clausthal, Feb. 22, 1998, pp. 159-164.

* cited by examiner

SILICON CARBIDE DEVICE WITH METALLIC INTERFACE LAYERS AND METHOD OF MANUFACTURING

TECHNICAL FIELD

Examples of the present disclosure relate to a silicon carbide device with metallic interface layers to doped regions, in particular to silicon carbide devices with ohmic metal/semiconductor interfaces. The present disclosure also relates to the manufacture of silicon carbide devices with ohmic metal/semiconductor interfaces.

BACKGROUND

Low-resistance and high reliability ohmic contacts on silicon carbide (SiC) are essential for SiC power devices such as SiC MOSFETs (metal oxide semiconductor field effect transistors). For achieving low resistive ohmic contacts between doped regions in a SiC body and conductive structures formed outside the SiC body, annealed nickel (Ni) has primarily been used in ohmic contact metallizations for n type SiC, and aluminum (Al) has primarily been used in ohmic contact metallizations for p type SiC. The use of nickel aluminum (NiAl) alloys or compounds facilitates the use of one single contact material for both n type SiC and p type SiC.

The ongoing demand for more efficient power semiconductor devices drives the trend to smaller devices. There is a steady need to save chip area without adverse impact on the device performance.

SUMMARY

An embodiment of the present disclosure relates to a method of manufacturing a semiconductor device. A trench is formed that extends from a first surface into a silicon carbide body. A first doped region and an oppositely doped second doped region are formed in the silicon carbide body. A lower layer structure is formed on a lower sidewall portion of the trench. An upper layer stack is formed on an upper sidewall portion of the trench and/or on the first surface. The first doped region and the upper layer stack are in direct contact along the upper sidewall portion and/or on the first surface. The second doped region and the lower layer structure are in direct contact along the lower sidewall portion.

Another embodiment of the present disclosure relates to a silicon carbide device that includes a silicon carbide body. A first doped region and a second doped region are formed in the silicon carbide body, wherein the first doped region is n doped and the second doped region is p doped. A first interface layer in direct contact with the first doped region includes a first metal silicide/carbide containing a first transition metal. A first buffer layer is formed directly on the first interface layer. A second interface layer in direct contact with the second doped region includes a second metal silicide/carbide containing a second refractory metal. The second interface layer is formed along at least a lower sidewall portion of a trench that extends from a first surface into the silicon carbide body.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a silicon carbide device and a method of manufacturing a semiconductor device and together with the description serve to explain principles of the embodiments. The drawings are not scaled and are for illustrative purposes only. Corresponding elements are designated by the same reference signs in the different drawings if not stated otherwise.

DETAILED DESCRIPTION

Figure 1A:
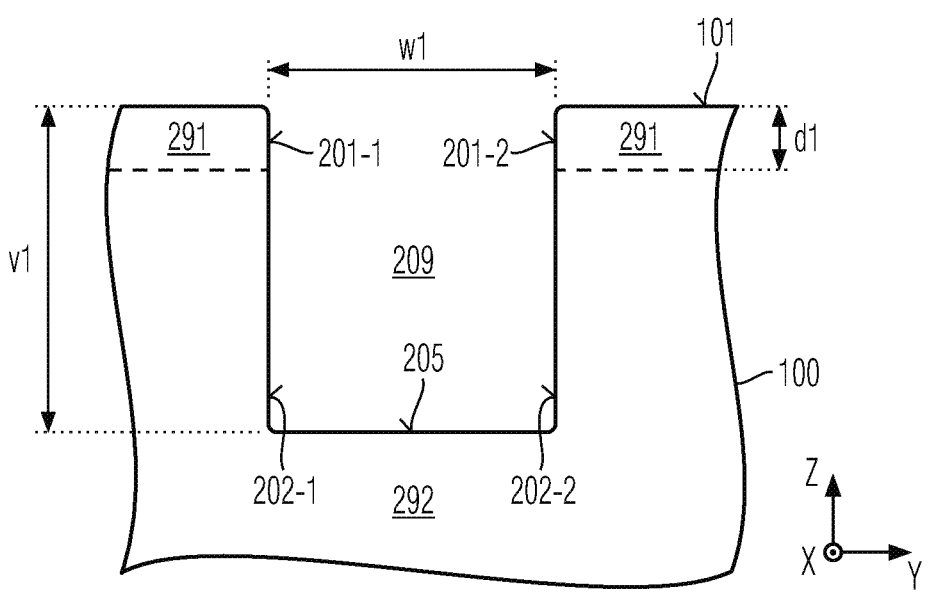
FIGS. 1A to 1D show schematic vertical cross-sectional views of a portion of a silicon carbide body for illustrating a method of manufacturing a silicon carbide device with a metallic upper layer stack in contact with a first doped region along an upper trench sidewall portion and with a metallic lower layer structure in contact with a second doped region along a lower trench sidewall portion according to an embodiment.

In the following detailed description, reference is made to the accompanying drawings, which form a part hereof and in which are shown by way of illustrations specific embodiments in which a silicon carbide device and a method of manufacturing a semiconductor device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims.

The terms "having", "containing", "including", "comprising" and the like are open ended terms indicate the presence of stated structures, elements or features but do not preclude the presence of additional structures, elements or features. The articles "a", "an" and "the" are intended to include the plural as well as the singular, unless the context clearly indicates otherwise.

The expression "and/or" should be interpreted to mean all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

The term "electrically connected" describes a permanent low-resistive ohmic connection between electrically connected elements, for example a direct contact between the concerned elements or a low-resistive connection via a metal and/or heavily doped semiconductor material.

An "ohmic contact" is a non-rectifying electrical junction with a linear or almost linear current-voltage characteristic.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Ranges given for physical dimensions include the boundary values. For example, a range for a parameter y from a to b reads as $a \leq y \leq b$. The same holds for ranges with one boundary value like "at most" and "at least".

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

Two adjoining doping regions in a semiconductor portion form a semiconductor junction. Two adjoining doping regions of the same conductivity type and with different dopant concentrations form a unipolar semiconductor junction, e.g. an n/n+ or p/p+ junction along a boundary surface between the two doping regions. At the unipolar junction, a dopant concentration profile orthogonal to the unipolar junction may show a step or a turning point, at which the dopant concentration profile changes from being concave to convex, or vice versa. Two adjoining doping regions of complementary conductivity form a pn junction.

As regards structures and doped regions formed in a semiconductor portion, a second region is "below" a first region if a minimum distance between the second region and a first main surface at the front side of the semiconductor portion is greater than a maximum distance between the first region and the first main surface. The second region or a junction is "directly below" the first region, where the vertical projections of the first and second regions or the vertical projections of the first region and the junction into the first main surface overlap. The vertical projection is a projection orthogonal to the first main surface. A "horizontal plane" is a plane parallel to a planar first main surface or parallel to coplanar surface sections of the first main surface.

Transition metals include elements with atomic numbers 21-30, 39-48, and 57-80. The term post-transition metal is used in the wide sense for the elements with atomic numbers 13, 30-31, 48-50, and 80-83. The term refractory metal is used in the wide sense for the elements with atomic numbers 22-25, 40-45, and 72-77.

A method of manufacturing a semiconductor device according to the present disclosure may include forming a trench extending into a silicon carbide body from a first surface. A first doped region and an oppositely doped second doped region may be formed in the silicon carbide body. A lower layer structure may be formed on a lower sidewall portion of the trench. An upper layer stack may be formed on an upper sidewall portion of the trench and/or on the first surface. The first doped region and the upper layer stack may be in direct contact along the upper sidewall portion and/or on the first surface. The second doped region and the lower layer structure may be in direct contact along the lower sidewall portion.

The silicon carbide body may have two parallel or approximately parallel main surfaces, which may have approximately the same shape and size. The silicon carbide body may have a surface extension along two horizontal directions and may have a thickness along a vertical direction perpendicular to the horizontal directions. In the following, the horizontal directions are also referred to as lateral directions, the main surface at the front side is referred to as first surface and the main surface at the side opposite to the front side is referred to as second surface. A lateral outer surface connects the edge of the first surface with the edge of the second surface. The silicon carbide body includes a semiconducting part from a silicon carbide crystal, in particular from silicon carbide with a hexagonal polytype, e.g. the 4H-polytype. In addition to the semiconducting part, the silicon carbide body may include structures from other materials like polycrystalline silicon, dielectrics, elemental metals, metal compounds and/or metal alloys.

Forming the trench may include masked reactive ion beam etching. The trench may have sidewalls that run along or inclined to the vertical direction. In particular, the trench may taper with increasing distance from the first surface. The trench may be strip-shaped with a horizontal longitudinal extent (trench length l1) greatly exceeding a horizontal width extent (trench width w1). One or both of the longitudinal trench sidewalls are coplanar or approximately coplanar with a main crystal plane in the silicon carbide body.

The trench has a lower sidewall portion that may include lower sidewall sections on both longitudinal trench sidewalls. The lower sidewall sections may be formed symmetrically with respect to a vertical central plane of symmetry of the trench. The lower layer structure may also be in direct contact with a trench bottom connecting the two lower sidewall sections or may be separated from the trench bottom. In particular, the lower sidewall portion includes a portion of the trench sidewall extending from a first distance d1 from the first surface down to the trench bottom.

The upper sidewall portion includes a portion of the trench sidewall between the first surface and the lower sidewall portion and extends from the first surface down to the first distance d1.

The lower layer structure may have uniform or almost uniform thickness and may be a single layer. Alternatively, the lower layer structure may be a layer stack including two or more sublayers stacked on each other, wherein the sublayers differ in at least one main constituent. A thickness th1 of the lower layer structure is less than half the trench width w1.

The upper layer stack is a layer stack of uniform or almost uniform thickness and includes two or more sublayers stacked on each other, wherein the sublayers differ in at least one main constituent. A thickness th2 of the upper layer stack is less than half the trench width w1.

The lower layer structure and the upper layer stack may differ in the composition and/or structural configuration of at least one of the sublayers.

One of the first doped region and the second doped region, or both may be formed prior to forming the trench, after forming the trench and prior to forming the lower layer structure and the upper layer stack, after forming the lower layer structure and prior to forming the upper layer stack, or after forming the lower layer structure and the upper layer stack.

The lower layer structure may be used to form a first low resistance ohmic contact with a p type region. For example, a heat treatment may convert at least a portion of the lower layer structure and an adjoining vertical layer portion of the silicon carbide body into a first metal silicide/carbide.

The upper layer stack may be used to form a second low resistance ohmic contact with an n type region. For example, a heat treatment may convert at least a portion of the upper layer stack and an adjoining vertical layer portion of the silicon carbide body into a second metal silicide/carbide.

A contact structure can be formed in the trench, wherein the contact structure provides low resistance ohmic contacts with both a p type region and an n type region. The size of the contact area of such a contact structure can be decoupled to some degree from the trench width. The comparatively large contact areas in combination with suitable specific interface structures for n type and p type regions may reduce electrical losses and contribute to improving the efficiency of a silicon carbide device.

According to an embodiment, the lower layer structure may be also formed directly on a trench bottom of the trench. The trench bottom may expose a portion of the second doped region. In particular, the trench may extend into the second doped region.

A total contact area between the lower layer structure and the second doped region may be at least two times or at least five times of w1*l1, wherein w1 is the trench width in the plane of the first surface and l1 is the trench length in the plane of the first surface.

According to an embodiment, the upper layer stack may be formed after forming the lower layer structure. The contact area between the lower layer structure and the second doped region may be increased by a comparatively simple vertical patterning process.

According to an embodiment, forming the lower layer structure may include forming a lower film coating the lower sidewall portion and the upper sidewall portion, forming an etch mask covering a first section of the lower film on the lower sidewall portion and exposing a second section of the lower film on the upper sidewall portion, and selectively removing the second section of the lower film. The remaining first section of the lower film forms the lower layer structure.

According to an embodiment, forming the upper layer stack may include forming an upper film coating the upper sidewall portion and/or a collar portion of the first surface directly next to the trench.

The upper layer stack may be formed directly after removal of the second section of the lower film and, if applicable, after removal of a mask used for selectively removing the second section of the lower film. In particular, a section of the upper layer stack may be formed directly on the lower layer structure.

According to an embodiment, the method may further include forming a fill portion in the trench after formation of the lower layer structure and the upper layer stack.

The fill portion may be formed on the lower layer structure and the upper layer stack or on the upper layer stack alone in case the upper layer stack completely covers the lower layer structure. The lower layer structure and the upper layer stack separate the fill portion and the silicon carbide body.

In particular, forming the fill portion may include one continuous deposition process or two separated deposition processes. For example, the upper layer stack may include a section formed directly on the lower layer structure. The fill portion is completely formed on the upper layer stack in one continuous deposition process. Alternatively, a first fill part may be formed on the lower layer structure prior to forming the upper layer stack. The upper layer stack is formed on the upper sidewall portion and/or the first surface and on an exposed surface of the first fill part in the trench. A second fill part is formed on the upper layer stack.

According to an embodiment, forming the lower layer structure may include forming in-situ a first sublayer and forming a second sublayer on the first sublayer.

In particular, in-situ formation of the first sublayer and the second sublayer includes loading a silicon carbide wafer into a deposition chamber for ALD (atomic layer deposition), sputtering, CVD (chemical vapor deposition), or PVD (physical vapor deposition) and depositing the first sublayer. After deposition of the first sublayer, the silicon carbide wafer remains in the deposition chamber and the second sublayer is formed directly after deposition of the first sublayer or after purging the deposition chamber with an inert gas.

Subsequently, a heat treatment of the silicon carbide body may cause diffusion of atoms from the first sublayer into the second sublayer and vice versa. Alternatively, a single layer may be deposited containing atoms of at least two different metals, e.g. a transition metal and a post-transition metal.

According to an embodiment, the lower layer structure may contain at least one of titanium and tantalum and further contains aluminum.

In particular, the lower layer structure may contain at least one refractory metal and a further metal, e.g. a post-transition metal like aluminum.

For example, the lower layer structure includes a single layer containing both aluminum and at least one refractory metal, e.g. a titanium aluminum alloy. The lower layer structure may include one or more further layers in addition to the layer containing both aluminum and at least one refractory metal.

Alternatively, the lower layer structure includes at least a first sublayer that contains or consists of at least one refractory metal, e.g. titanium and/or tantalum, and a second sublayer formed on the first sublayer, wherein the second sublayer contains or consists of aluminum.

For example, the first sublayer contains or consists of titanium and/or tantalum and the second sublayer contains or consists of aluminum. A thickness of the first sublayer may be in a range from 5 nm to 20 nm. A thickness of the second sublayer may be in a range from 15 nm to 200 nm, e.g. from 15 nm to 100 nm wherein a ratio between the thickness of the first sublayer to the thickness of the second sublayer may be in a range from about 1:1 to about 1:3, for example about 1:3. For example, the first sublayer may be a titanium layer with a thickness of 50 nm and the second sublayer may be an aluminum layer with a thickness of 150 nm, or the first sublayer may be a titanium layer with a thickness of 20 nm and the second sublayer may be an aluminum layer with a thickness of 60 nm, or the first sublayer may be a titanium layer with a thickness of 5 nm and the second sublayer may be an aluminum layer with a thickness of 15 nm. In some examples, a ratio between the thickness of the first sublayer to the thickness of the second sublayer may be in a range from about 1:5 to about 5:1.

According to an embodiment, forming the upper film may include forming in-situ a third sublayer and a fourth sublayer directly on the third sublayer.

In particular, in-situ formation of the third sublayer and the fourth sublayer includes loading a silicon carbide wafer into a deposition chamber for ALD, sputtering, CVD, or PVD, and depositing the third sublayer. After deposition of the third sublayer, the silicon carbide wafer remains in the deposition chamber and the fourth sublayer is formed directly after deposition of the third sublayer or after purging the deposition chamber with an inert gas.

The third sublayer may consist of or contain at least one first metal selected from titanium and tantalum. The fourth sublayer may consist of or contain a second metal or a nitride of the first metal.

In particular, the third sublayer may consist of titanium and/or tantalum. The fourth sublayer may consist of another elemental metal or of a metal nitride, wherein the metal in the third sublayer and the fourth sublayer may be the same, e.g. a titanium nitride and/or a tantalum nitride. A thickness of the third sublayer may be in a range from 15 nm to 200 nm, e.g. from 15 nm to 60 nm. A thickness of the fourth sublayer may be in a range from 20 nm to 200 nm, wherein a ratio between the thickness of the third sublayer to the fourth sublayer may be in a range from 0 to ∞, e.g. about 3:4.

According to an embodiment, none of the lower layer structure and the upper layer stack contains more than a negligible amount of nickel Ni. Each of the lower layer structure and the upper layer stack may contain nickel Ni only as an undesirable impurity.

Since nickel is a critical impurity for silicon devices, nickel-free contacts for silicon carbide devices facilitate the fabrication of silicon and silicon carbide wafers on the same manufacturing equipment and allow more flexibility in a wafer line. In addition, patterning nickel-containing layers typically requires a lift-off process. Lift-off processes are more difficult to control than wet etch processes and are not readily suitable for vertical patterning. By eliminating nickel, the processes described above simplify manufacturing processes and also enable vertical patterning of contact interface layers and a nickel-free contact structure for silicon carbide devices.

Another embodiment of the present disclosure relates to a silicon carbide device that includes a silicon carbide body. A first doped region and a second doped region may be formed in the silicon carbide body, wherein the first doped region is n doped and the second doped region is p doped. A first interface layer in direct contact with the first doped region includes a first metal silicide/carbide containing a first transition metal. A first buffer layer is formed directly on the first interface layer. A second interface layer in direct contact with the second doped region includes a second metal silicide/carbide containing a second refractory metal. The second interface layer is formed along at least a lower sidewall portion of a trench that extends from a first surface into the silicon carbide body.

The first doped region may contain phosphorus and/or nitrogen as only dopant(s) or may contain further donor and/or acceptor atoms. The first doped region may be n conductive (n type).

The second doped region may contain aluminum and/or boron as only dopant(s) or may contain further acceptor and/or donor atoms. The second doped region may be p conductive (p type).

The first doped region may be formed between the first surface and the second doped region.

The first interface layer may be a structure of uniform or almost uniform thickness. For example, the thickness of the first interface layer may be about 20 nm to 200 nm.

The first metal silicide/carbide contains at least one binary phase of Me1 and Si in combination with at least one binary phase of Me1 and C. Alternatively or in addition, the first metal silicide/carbide contains a ternary phase of Me1, Si, and C. Me1 represents a first transition metal. The first transition metal may be nickel Ni or a first refractory metal, for example titanium Ti or tantalum Ta. The first interface layer and the first doped region form a low-resistive first ohmic contact.

The first buffer layer may be formed directly on the first interface layer and may be a liner of uniform or approximately uniform thickness. The thickness of the first buffer layer may be about 30 nm to 200 nm. The first buffer layer may include a metal nitride, e.g. a nitride of the first refractory metal, or an elemental metal different from the first refractory metal.

The second interface layer may be a structure of uniform or approximately uniform thickness. For example, the thickness of the second interface layer may be about 20 nm to 50 nm.

The second metal silicide/carbide contains at least one binary phase of Me2 and Si in combination with at least one binary phase of Me2 and C. Alternatively or in addition, the second metal silicide/carbide contains a ternary phase of Me2, Si, and C. Me2 represents a second refractory metal, for example titanium Ti or tantalum Ta. The second refractory metal and the first refractory metal may be the same refractory metal or may be different refractory metals. In addition, the second metal silicide/carbide may contain phases containing a post-transition metal, e.g. aluminum Al. The second interface layer and the second doped region form a low-resistive second ohmic contact.

The second interface layer is formed along at least a lower sidewall portion of a trench that extends from a first surface into the silicon carbide body.

The second interface layer may include sidewall sections on opposite trench sidewalls and may further include a bottom section formed along the trench bottom, wherein the bottom section connects the sidewall sections.

The first interface layer may be in direct contact exclusively with the first doped region. Alternatively, the first interface layer may also be in direct contact with an overlapping portion of the second doped region to some degree, and/or in direct contact with one or more further doped regions. The second interface layer may be in direct contact exclusively with the second doped region. Alternatively, the second interface layer may also be in direct contact with an overlapping portion of the first doped region to some degree, and/or in direct contact with one or more further doped regions.

Being formed on sidewalls of a trench contact structure, the second interface layer decouples to some degree the contact area for the p doped second region from the lateral extension of the contact structure and facilitates low resistance contacts even for dense layouts.

According to an embodiment, a second buffer layer may be formed directly on the second interface layer.

The second buffer layer may be a liner of uniform or approximately uniform thickness. The thickness of the second buffer layer may be about 20 nm to 200 nm.

The second buffer layer contains an elemental metal, a metal compound and/or a metal alloy. The metal may be a post-transition metal. The second buffer layer and the first buffer layer may differ in at least one main constituent.

The second buffer layer may include sidewall sections formed directly on the sidewall sections of the second interface layer and may further include a bottom section formed directly on the bottom section of the second interface layer. Further layers of uniform or almost uniform thickness may be formed on the second buffer layer.

The second interface layer and the second buffer layer may be parts of a lower contact portion of a contact structure, wherein the lower contact portion of the contact structure is formed below a plane coplanar with the first surface.

The lower contact portion may further include a lower fill part filling the space left by vertical sublayers of the lower contact portion. The lower fill part may contain an elemental metal, e.g. tungsten W, a metal alloy, and/or polycrystalline silicon.

According to an embodiment, the first buffer layer may include a metal nitride. For example, the first buffer layer contains titanium nitride and/or tantalum nitride.

According to an embodiment, the first interface layer may include a portion formed along an upper sidewall portion, wherein the upper sidewall portion is between the first surface of the silicon carbide body and the lower sidewall portion.

In particular, the first interface layer and the first buffer layer may be parts of an upper contact portion of the contact structure, wherein the upper contact portion is formed between a plane coplanar with the first surface and the lower contact portion.

The first interface layer may include sidewall sections on opposite trench sidewalls and may further include a top section formed on a collar portion of the first surface.

The first buffer layer may include sidewall sections formed directly on the sidewall sections of the first interface layer and may further include a top section formed directly on the top section of the first interface layer.

The upper contact portion may further include an upper fill part filling the space left by vertical sublayers in a portion of the contact structure between the first surface and the lower contact portion. The second fill part may contain an elemental metal, e.g. tungsten W, a metal alloy, and/or polycrystalline silicon.

According to an embodiment, the second buffer layer may contain aluminum. In particular, the second buffer layer may consist of aluminum or an aluminum alloy.

FIGS. 1A to 1D illustrate the formation of a contact structure for a silicon carbide device based on a silicon carbide body 100.

The silicon carbide body 100 has a first surface 101 at a front side and a second surface opposite to the front side. The first surface 101 is a section of a front side surface of a monocrystalline SiC substrate, e.g. a SiC wafer. The second surface is a section of a backside surface of the SiC substrate. The SiC substrate includes a silicon carbide crystal containing dopant atoms and further impurities like hydrogen, fluorine and/or oxygen. The polytype of the silicon carbide crystal may be 15R or hexagonal, e.g. 2H, 6H, or 4H.

The first surface 101 and the second surface may extend parallel to each other, wherein the first surface 101 may be planar or serrated. In case of a serrated first surface 101, a mean plane through the serrated main surface 101 is considered as first surface 101 in the following for simplicity. The mean plane of a planar first surface 101 is identical with the planar first surface 101. In case of a serrated first surface 101, the mean plane is a planar least squares plane. Position and orientation of the planar least squares plane are defined such that the sum of the squares of the deviations of surface points of the serrated first surface 101 from the planar least squares plane has a minimum value.

The silicon carbide body 100 extends along a main extension plane in horizontal directions along the x-axis and the y-axis, which is orthogonal to the x-axis. The horizontal directions are also referred to as lateral directions in the following. In a vertical direction along the z-axis and perpendicular to the horizontal directions, the silicon carbide body 100 has a thickness, which is small compared to the extension of the silicon carbide body 100 along the main extension plane. For a vertical silicon carbide device with a vertical load current flow, a total thickness of the silicon carbide body 100 between the first surface 101 and the second surface is related to a nominal blocking capability of the silicon carbide device and may be in a range from several hundred nm to several hundred μm.

The vertical direction may coincide with a main lattice direction of the silicon carbide body 100 or may be tilted with respect to a main lattice direction by an off-axis angle, wherein the off-axis angle may be in a range from 2° to 8° in absolute value. For example, the off-axis angle may be about 4°.

A trench 209 is formed in the first surface 101 of the silicon carbide body 100, e.g. by masked ion beam etching. Prior to or after forming the trench 209, a first doped region 291 and an oppositely doped second doped region 292 are formed in the silicon carbide body 100.

FIG. 1A shows the trench 209 extending from the first surface 101 into the silicon carbide body 100. The trench 209 may be strip-shaped with a trench width w1 along the y-axis, a trench length along the x-axis, and a vertical extension v1 along the z-axis. The longitudinal sidewalls of the trench 209 are vertical.

The first doped region 291 is formed between the first surface 101 and the second doped region 292 and extends from the first surface 101 down to a first distance d1 from the first surface 101. The first distance d1 is smaller than the vertical extension v1 of the trench 209. An upper sidewall portion 201 of the longitudinal sidewalls of the trench 209 exposes the first doped region 291, wherein the upper sidewall portion includes upper sidewall sections 201-1, 201-2 on opposite trench sidewalls. The two upper sidewall sections 201-1, 201-1 are formed symmetrically with respect to a vertical central plane of symmetry of the trench 209.

In a lower part of the trench 209, a lower sidewall portion 202 of the longitudinal trench sidewalls extending from the first distance d1 from the first surface 101 down to the trench bottom 205 exposes the second doped region 292, wherein the lower sidewall portion 202 includes lower sidewall sections 202-1, 202-2 on opposite trench sidewalls. The two lower sidewall sections 202-1, 202-2 are formed symmetrically with respect to the vertical central plane of symmetry of the trench 209.

A lower layer structure 210 is formed on the lower sidewall portion 202 and on the trench bottom 205.

Figure 1B:
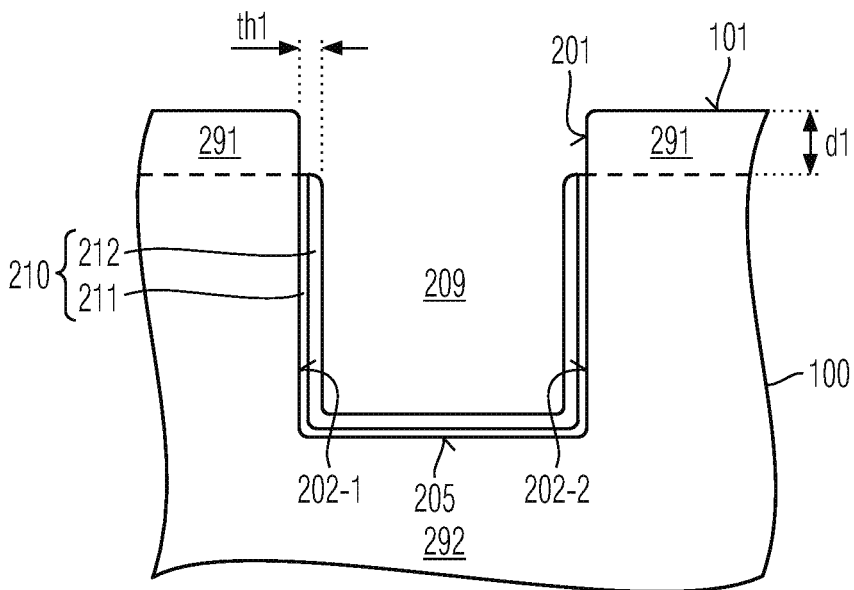

FIG. 1B shows the lower layer structure 210 formed on the lower sidewall sections 202-1, 202-2 and on the trench bottom 205. The lower layer structure 210 includes a first lower layer 211 and a second lower layer 212. The first lower layer 211 is formed directly on the lower sidewall sections 202-1, 202-2 and on the trench bottom 205. The first lower layer 211 contains at least one elemental refractory metal, e.g. titanium Ti. The second lower layer 212 is formed directly on the first lower layer 211. The second lower layer 212 contains at least one post-transition metal, e.g. aluminum.

Alternatively (not illustrated) the lower layer structure 210 includes a layer containing both titanium and aluminum with approximately equal parts of titanium atoms and aluminum atoms or with a ratio between aluminum atoms and titanium atoms of about 3:1. A total first thickness th1 of the lower layer structure 210 is in a range from 20 nm to 220 nm.

An upper layer stack 220 is formed on the upper sidewall portion 201 and on a collar portion 101-1 of the first surface 101 directly adjoining the opening of the trench 209 in the first surface 101.

Figure 1C:
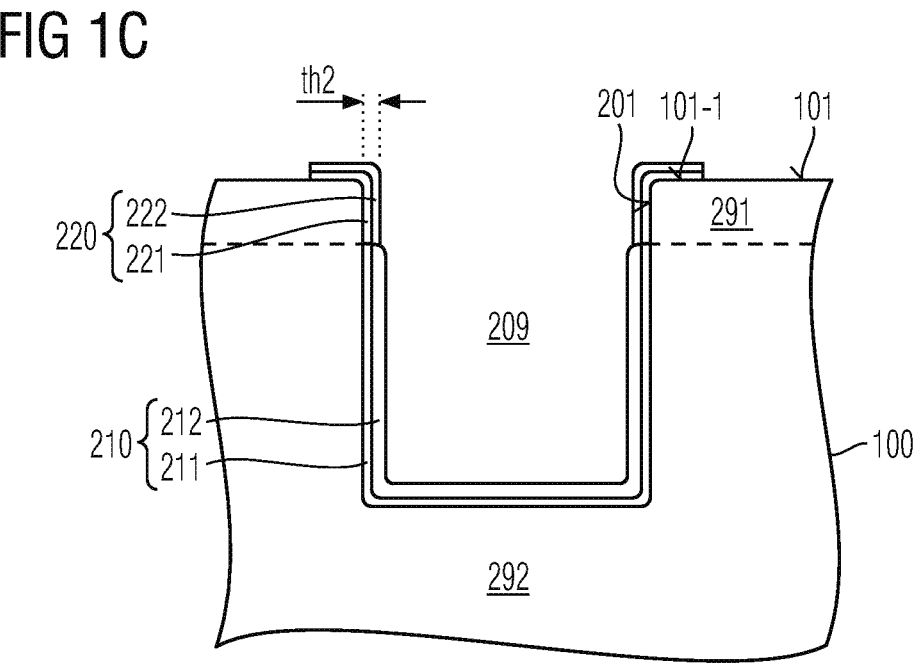

FIG. 1C shows the upper layer stack 220 formed on the upper sidewall sections 201-1, 201-2 and on the collar portion 101-1 of the first surface 101.

The upper layer stack 220 includes a first upper layer 221 and a second upper layer 222. The first upper layer 221 is formed directly on the upper sidewall sections 201-1, 201-2 and on the collar portion 101-1 of the first surface 101. The first upper layer 221 contains at least one elemental transition metal, e.g. nickel Ni or a refractory metal, e.g. titanium Ti. The second upper layer 222 is formed directly on the first upper layer 221. The second upper layer 222 contains at least one elemental metal other than the metal of the first upper layer 221 or a metal nitride, e.g. a nitride of the metal of the first upper layer 221, e.g. titanium nitride TiN.

A fill material is deposited to fill the trench 209. A part of the fill material deposited outside the trench 209 is removed.

Prior to or after deposition of the fill material, a heat treatment may convert the first lower layer 211 and/or the first upper layer 221 into metal silicide carbide, wherein the metal silicide carbide contains binary phases of metal silicide and metal carbide, and/or ternary phases containing both silicon and carbon. The heat treatment may include one or more RTP (rapid thermal processing) steps. In particular, the heat treatment may include a sequence of heat treatments at different temperatures and with different durations. For example, a first heat treatment at a lower temperature may form a metal alloy of the metals contained in the lower layer structure, such as a titanium aluminum alloy (TiAl) by alloying elemental titanium (Ti) and elemental aluminum (Al). A second heat treatment at a higher temperature may form silicides and/or carbides and/or ternary phases with the metal alloy formed by the first heat treatment.

Figure 1D:
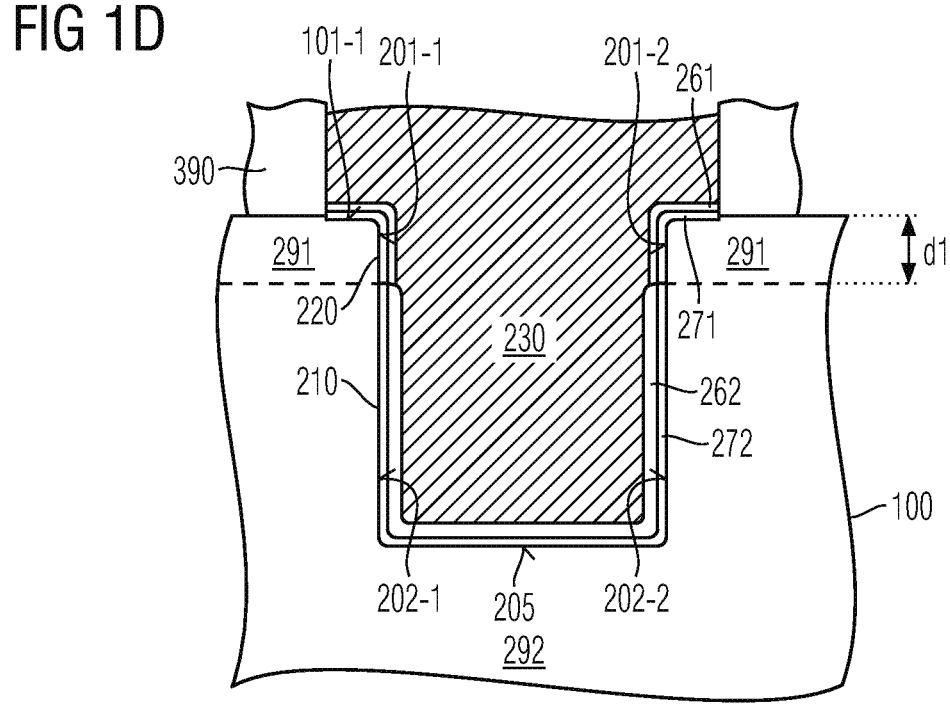

As illustrated in FIG. 1D, the residual part of the fill material in the trench 209 forms a fill portion 230 filling the space in the trench 209 left by the lower layer structure 210 and the upper layer stack 220. The fill portion 230 may also fill an opening formed in an interlayer dielectric 390 above the trench 209. The lower layer structure 210 and the upper layer stack 220 are formed between the silicon carbide body 100 and the fill portion 230.

The heat treatment converts the first upper layer 221 of FIG. 1C and an adjoining vertical layer portion of the silicon carbide body 100 into a first interface layer 271 as shown in FIG. 1D, and converts the first lower layer 211 of FIG. 1C and an adjoining vertical layer portion of the silicon carbide body 100 into a second interface layer 272 as shown in FIG. 1D. The second upper layer 222 of FIG. 1C forms a first buffer layer 261 on the first interface layer 271 as shown in FIG. 1D. The second lower layer 212 of FIG. 1C forms a second buffer layer 262 on the second interface layer 272 as shown in FIG. 1D.

The first doped region 291 and the first interface layer 271 are in direct contact along the upper sidewall sections 201-1, 201-2 and along the collar portion 101-1 of the first surface 101 directly adjacent to the opening of the trench 209 in the first surface 101.

The second doped region 292 and the second interface layer 272 are in direct contact along the lower sidewall sections 202-1, 202-2 and the trench bottom 205.

FIGS. 2A to 2E relate to a vertical patterning of a lower film 213 to provide the lower layer structure 210.

On the front side of a silicon carbide body 100 with a trench 209 extending from the first surface 101 into the silicon carbide body 100 as illustrated in FIG. 1A, a first sublayer 214 is deposited. A second sublayer 215 is deposited directly on the first sublayer 214. The first sublayer 214 and the second sublayer 215 are formed in-situ.

In particular, a silicon carbide wafer is loaded into deposition chamber for ALD, sputtering, CVD, or PVD. After deposition of the first sublayer 214, the silicon carbide wafer remains in the deposition chamber and the second sublayer 215 is formed directly after deposition of the first sublayer 214 or after purging the deposition chamber with an inert gas. No oxygen or nitrogen is introduced into the deposition chamber between forming the first sublayer 214 and forming the second sublayer 215.

Figure 2A:
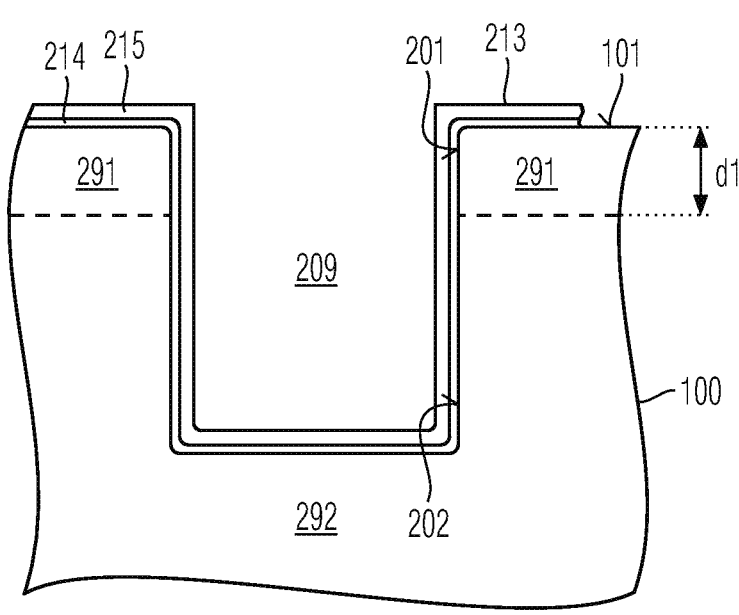
FIGS. 2A to 2E show schematic vertical cross-sectional views of a portion of a silicon carbide body for illustrating a method of manufacturing a silicon carbide device according to an embodiment related to an etch mask temporarily covering a portion of the lower layer structure.

As illustrated in FIG. 2A, the first sublayer 214 covers the lower sidewall portion 202, the upper sidewall portion 201 and the trench bottom 205. The second sublayer 215 covers the first sublayer 214. The first sublayer 214 and the second sublayer 215 form the lower film 213.

The first sublayer 214 contains or consists of titanium Ti and/or tantalum Ta. The second sublayer 215 contains or consists of aluminum Al. A thickness of the first sublayer 214 may be in a range from 5 nm to 20 nm. A thickness of the second sublayer 215 may be in a range from 15 nm to 200 nm, e.g. in a range from 15 nm to 60 nm. A ratio between the thickness of the first sublayer 214 and the second sublayer 215 may be about 1:1 or about 1:3.

A mask material is deposited in the trench 209 and on the first surface 101. The deposited mask material is recessed, wherein the mask material is removed from the first surface 101 and from an upper trench portion.

Figure 2B:
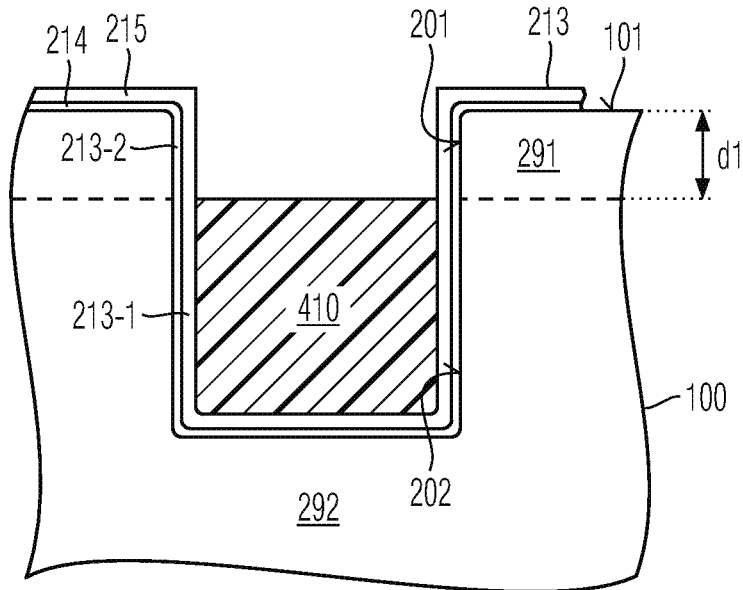

According to FIG. 2B, the residual portion of the recessed mask material forms an etch mask 410. The etch mask 410 covers a first section 213-1 of the lower film 213 on the lower sidewall portion 202 and exposes a second section 213-2 of the lower film 213 on the upper sidewall portion 201 and on the first surface 101. The material of the etch mask 410 may consist of or contain a resin, e.g. a photoresist material, amorphous silicon, or polycrystalline silicon, by way of example.

The exposed second section 213-2 of the lower film 213 is selectively removed.

Figure 2C:
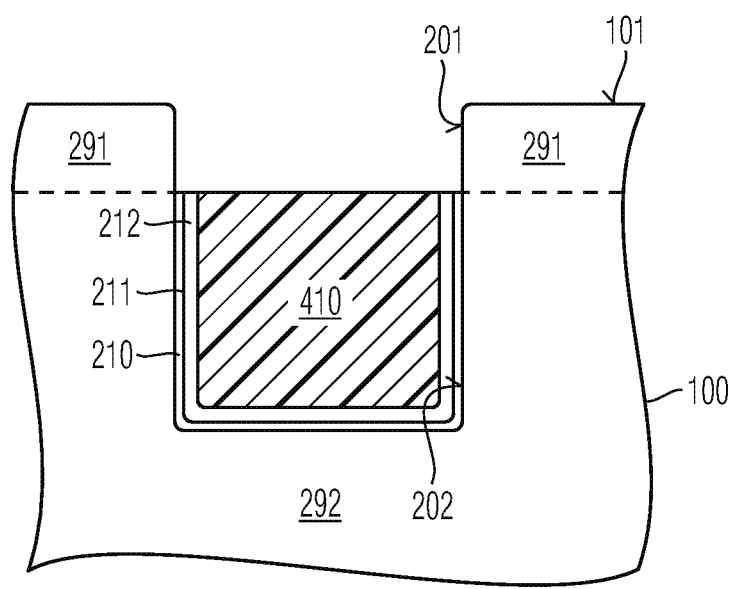

FIG. 2C shows the upper sidewall portion 201 exposed by the removal of the second section of the lower film 213. The residual first section 213-1 of the lower film 213 forms the lower layer structure 210 including a first lower layer 211 and a second lower layer 212 as described above.

The etch mask 410 may be selectively removed. A third sublayer 224 is deposited. A fourth sublayer 225 is deposited directly on the third sublayer 224. The third sublayer 224 and the fourth sublayer 225 are formed in-situ.

In particular, the silicon carbide wafer is loaded into a deposition chamber for ALD, CVD, PVD or sputtering. After deposition of the third sublayer 224, the silicon carbide wafer remains in the deposition chamber and the fourth sublayer 225 is formed directly after deposition of the third sublayer 224 or after purging the deposition chamber with an inert gas. No oxygen or hydrogen is introduced into the deposition chamber between deposition of the third sublayer 224 and deposition of the fourth sublayer 225.

Figure 2D:
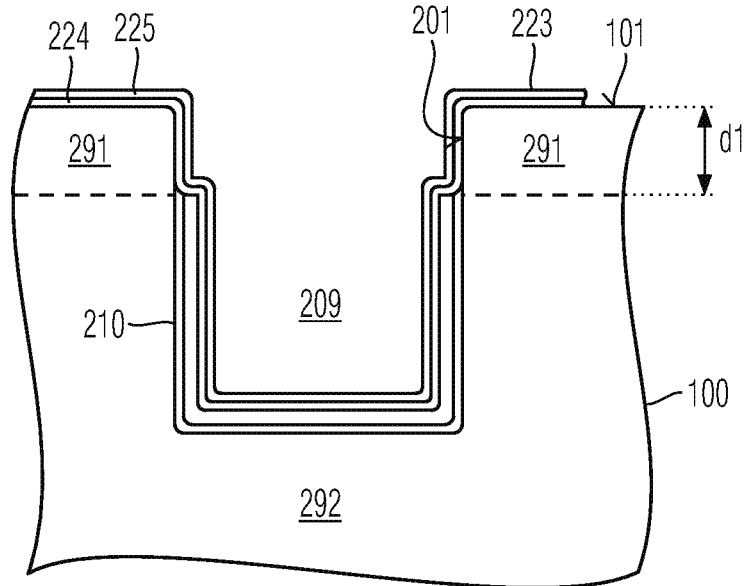

As illustrated in FIG. 2D, the third sublayer 224 may cover the first surface 101, the upper sidewall portion 201 and the lower layer structure 210. The fourth sublayer 225 covers the third sublayer 224. The third sublayer 224 and the fourth sublayer 225 form the upper film 223. A portion of the upper film 223 on the upper sidewall portion 201 corresponds to the upper layer stack 220 of FIG. 1C.

The third sublayer 224 consists of titanium Ti and/or tantalum Ta. The fourth sublayer 225 consists of a metal nitride. The metal in the third sublayer 224 and the fourth sublayer 225 be the same. For example, the fourth sublayer 225 contains or consists of titanium nitride and/or a tantalum nitride. A thickness of the third sublayer 224 may be in a range from 15 nm to 60 nm. A thickness of the fourth sublayer 225 may be in a range from 20 nm to 200 nm, wherein a ratio between the thickness of the third sublayer 224 and the fourth sublayer 225 may be about 3:4.

A fill material may be deposited and planarized. A section of the upper film 223 on the first surface 101 is removed. A heat treatment may form a first interface layer 271, a second interface layer 272, a first buffer layer 261, and a second buffer layer 262 on the basis of the deposited layers as described above. A fill structure 230 may be formed as described above prior to or after the heat treatment.

Figure 2E:
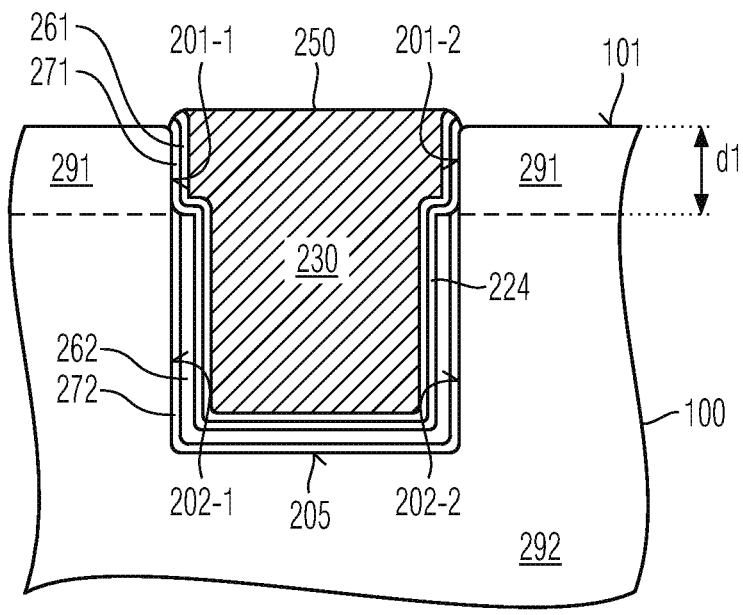

According to FIG. 2E, a residual portion of the deposited fill material forms a fill portion 230 completely formed on the first buffer layer 261 in one continuous deposition process.

Figure 3A:
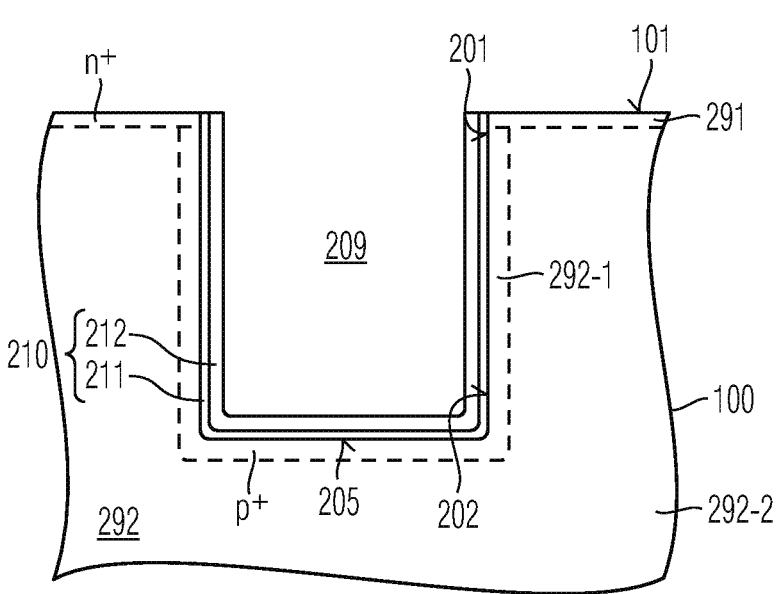
FIGS. 3A to 3B show schematic vertical cross-sectional views of a portion of a silicon carbide body for illustrating a method of manufacturing a silicon carbide device according to an embodiment related to an upper layer stack in contact with a portion of a horizontal first surface of the silicon carbide body.

FIG. 3A shows an embodiment with the lower layer structure 210 completely covering the trench sidewalls.

A lower film may be formed as described with reference to FIG. 2A (reference sign 213). An etch mask is formed that fills the trench 209 completely. A section of the lower film exposed by the etch mask is removed.

As illustrated in FIG. 3A, the etch process completely removes a section of the lower film formed on the first surface 101. The residual portion of the lower film forms a lower layer structure 210 that completely covers the trench sidewalls.

A first fill part 231 is deposited that fills the trench 209. An upper film may be formed as described above and patterned, wherein a residual part of the upper film forms an upper layer stack 220. A second fill part 232 is deposited on the upper layer stack 220 in an opening of an interlayer dielectric 390 formed above the first fill part 231. An n type first doped region 291 extends from the first surface 101 into the silicon carbide body 100. A p type second doped region 292 includes a main portion 292-2 and a more heavily doped contact portion 292-1 formed along the trench bottom 205 and the trench sidewalls.

Figure 3B:
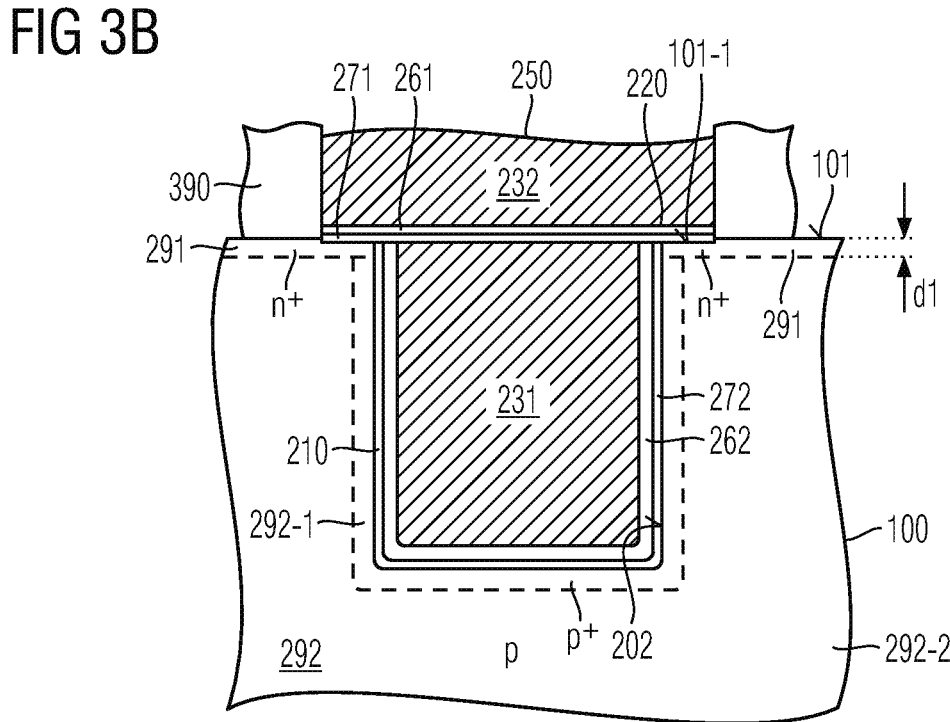

FIG. 3B shows the resulting contact structure 250 with a first fill part 231 extending from the first surface 101 into the silicon carbide body 100 and with a second fill part 232 formed above the first surface 101. The upper layer stack 220 and the first doped region 291 are in contact along the collar portion 101-1 of the first surface 101. In addition, the upper layer stack 220 covers the first fill part 231. The second fill part 232 is formed on the upper layer stack 220. The lower layer structure 210 and the contact portion 292-1 are in contact along the trench bottom 205 and along the trench sidewalls.

Figure 4A:
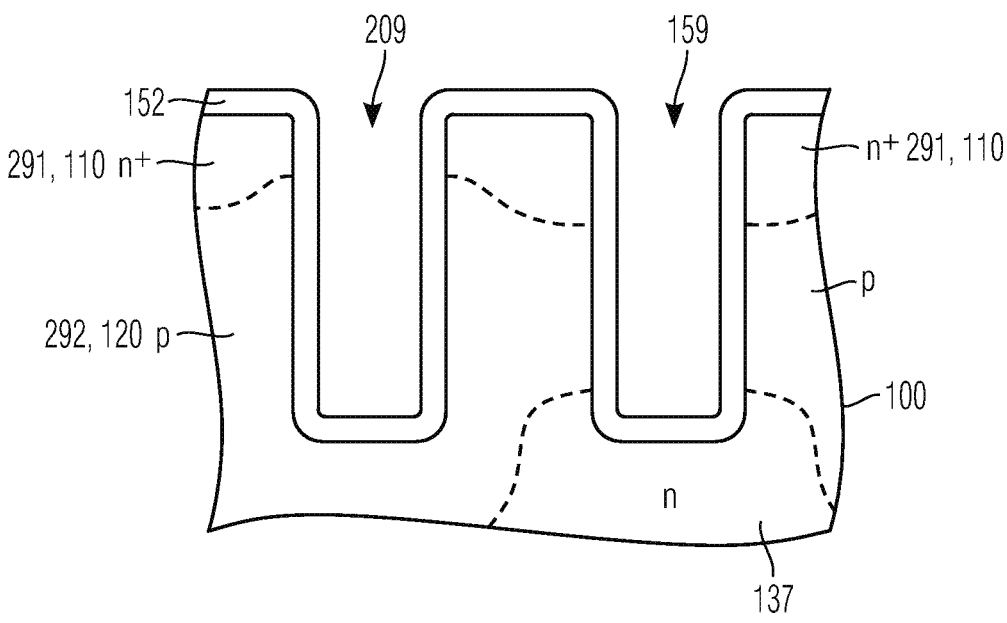
FIGS. 4A to 4Q show schematic vertical cross-sectional views of a portion of silicon carbide body for illustrating a method of manufacturing a silicon carbide device according to an embodiment related to a MOSFET with trench gate electrodes.
Figure 4B:
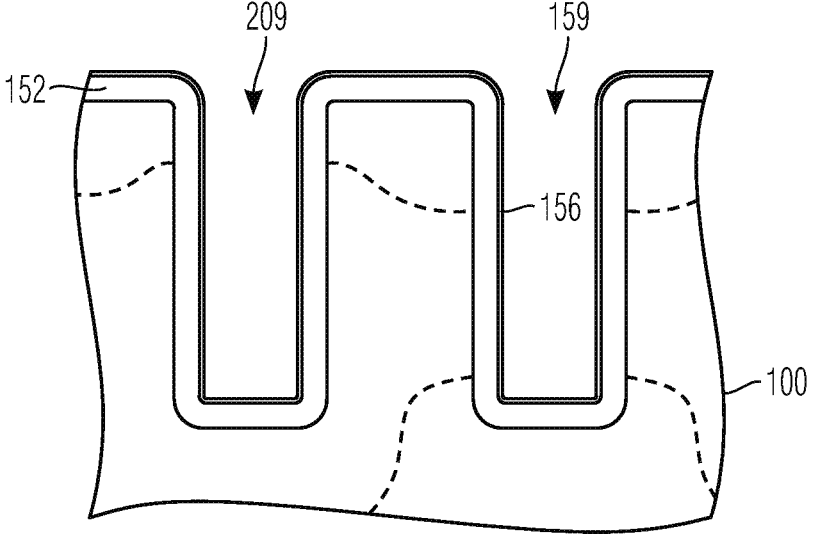
Figure 4C:
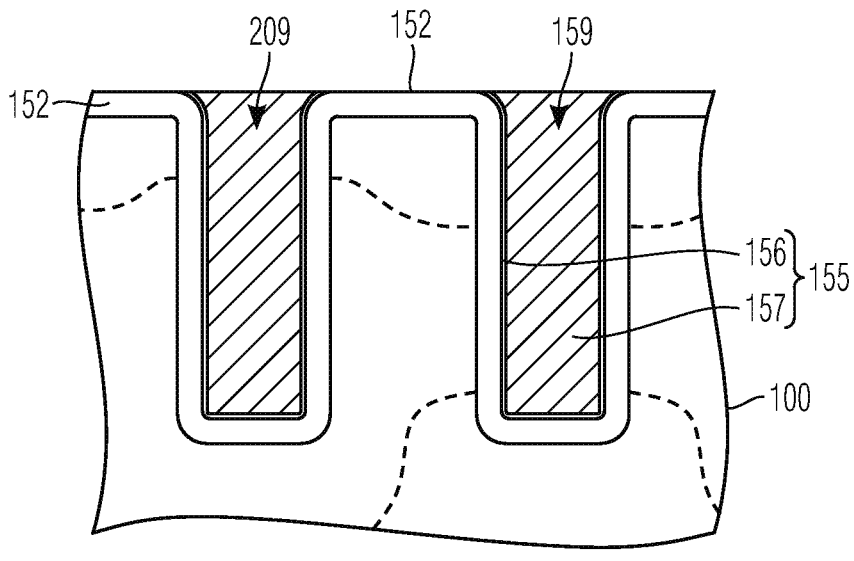
Figure 4D:
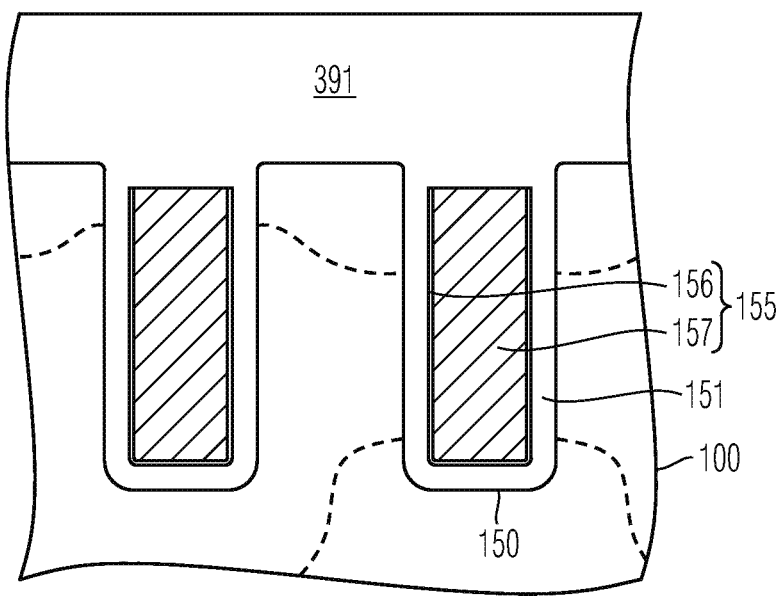
Figure 4E:
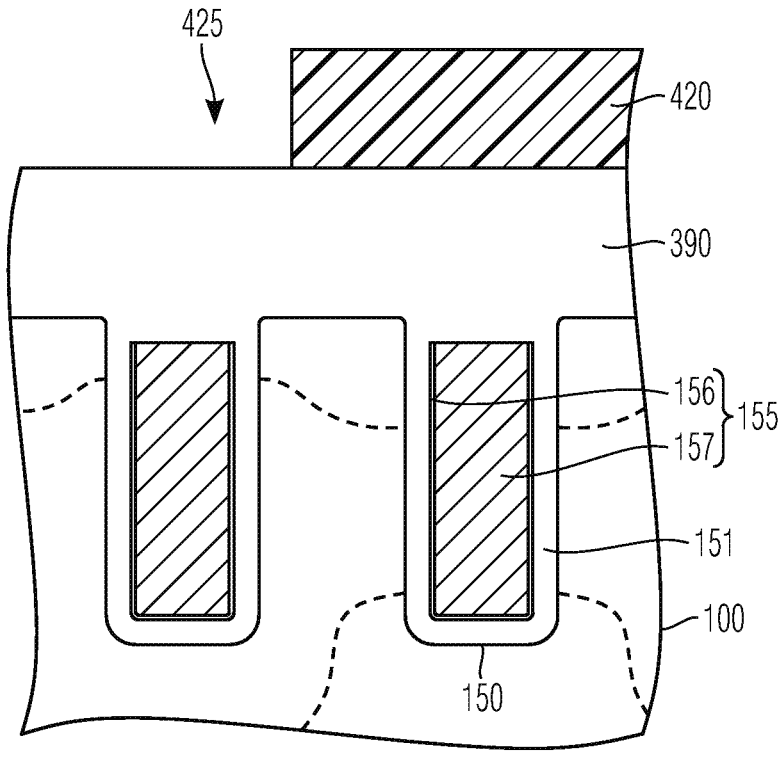
Figure 4F:
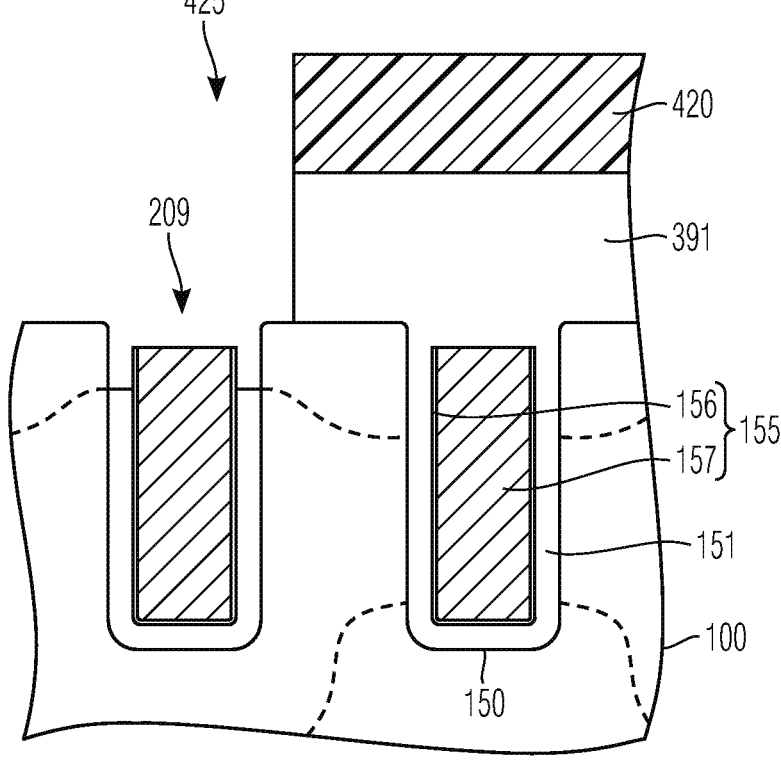
Figure 4G:
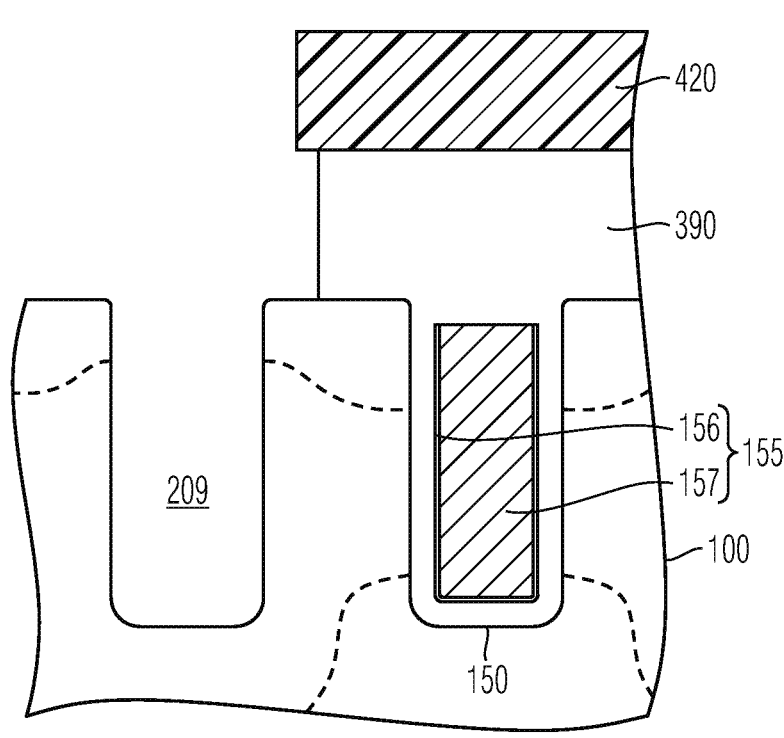
Figure 4H:
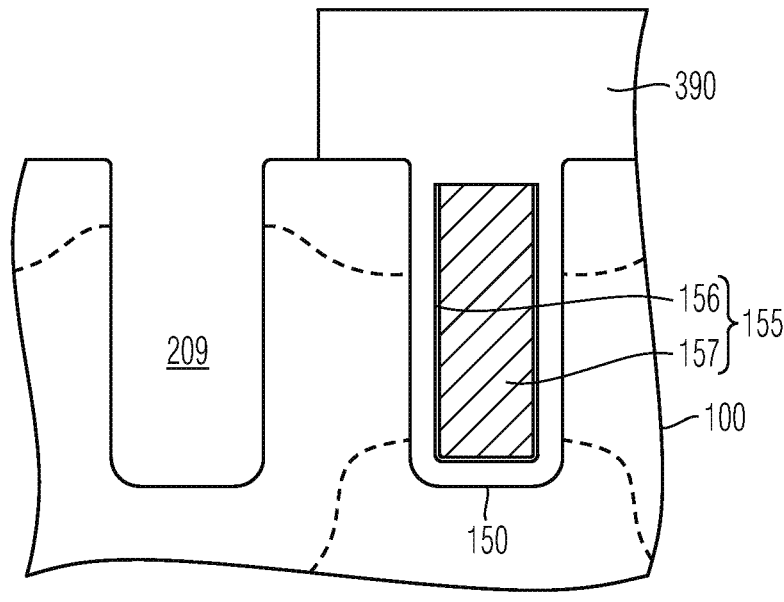
Figures 4I, 4J:
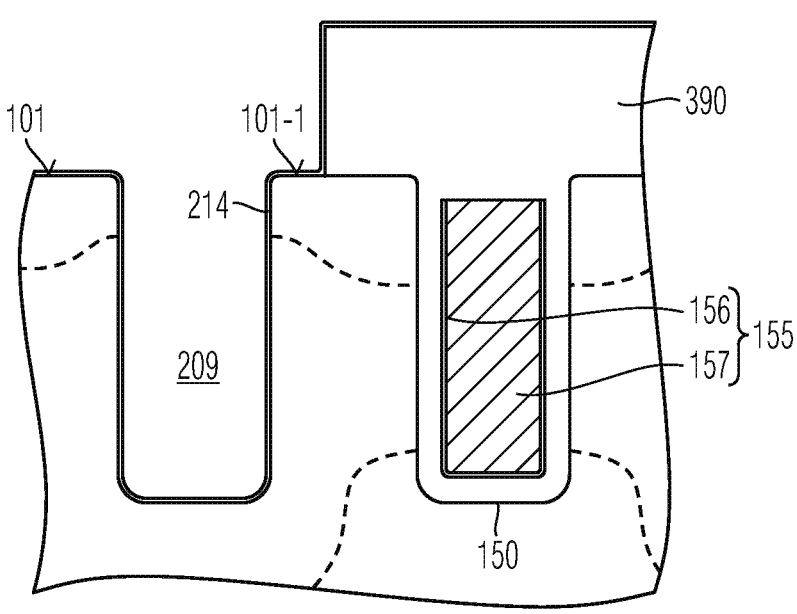
Figure 4K:
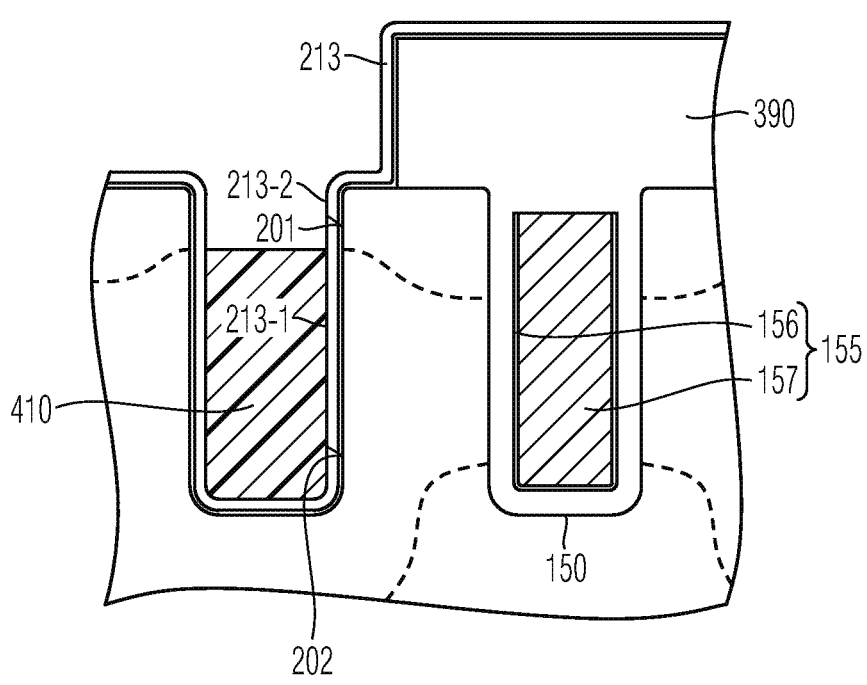
Figure 4L:
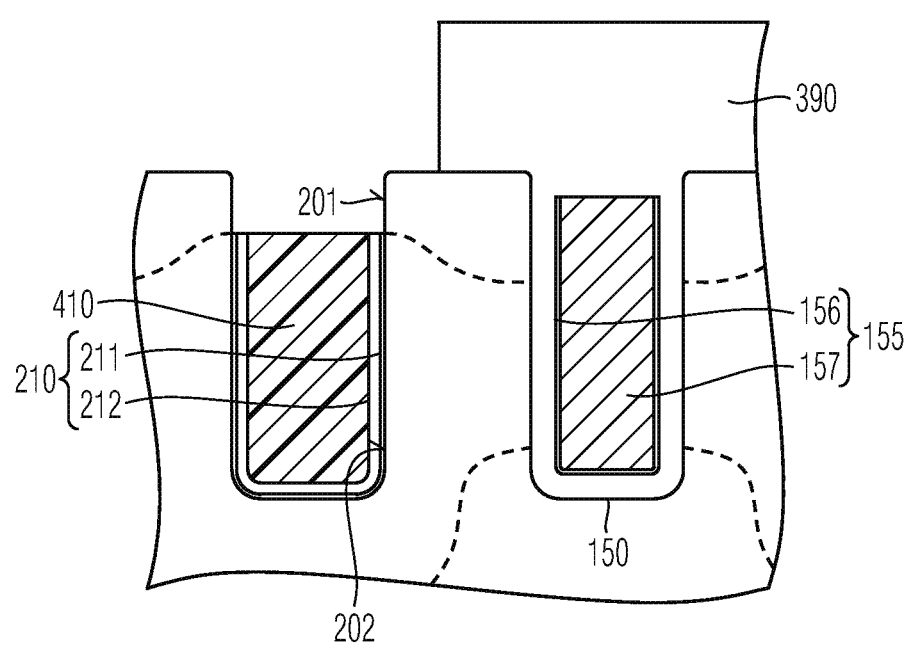
Figure 4M:
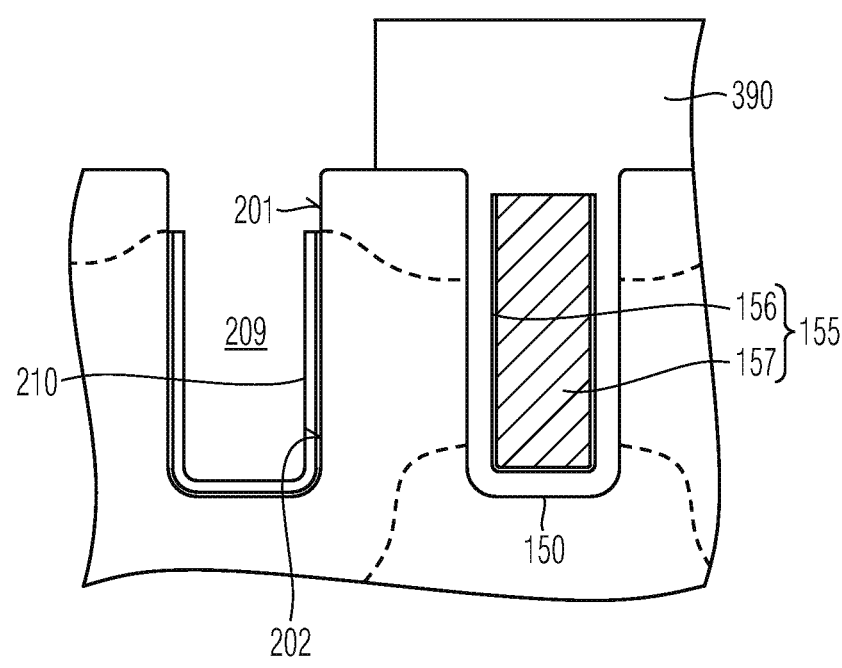
Figure 4N:
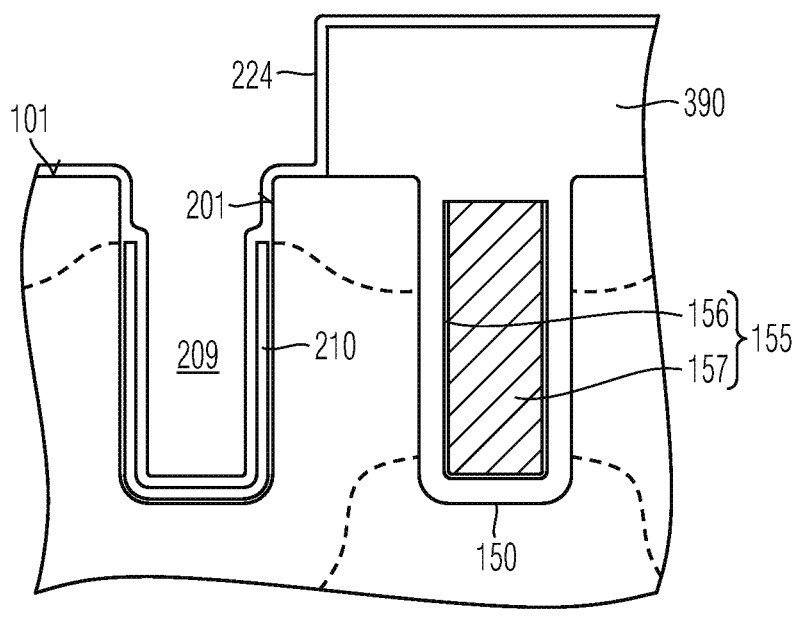
Figure 4O:
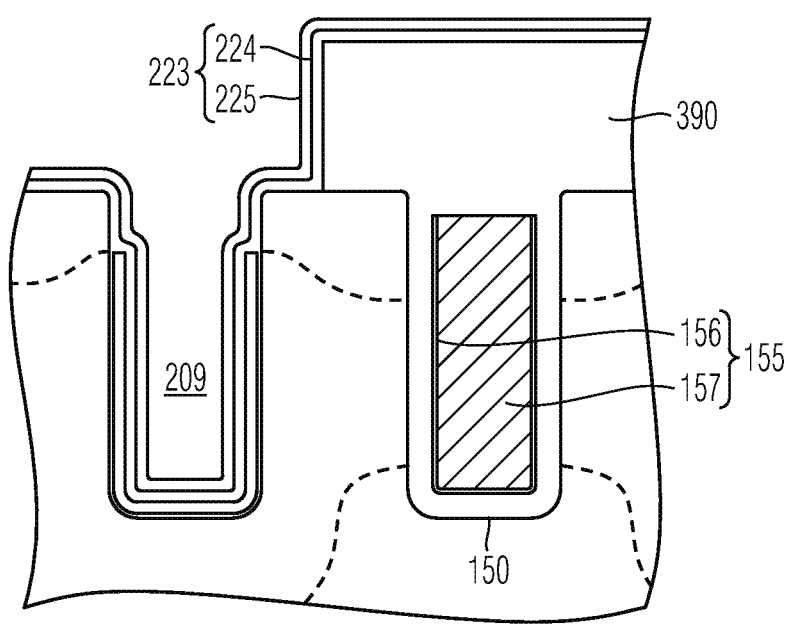
Figure 4P:
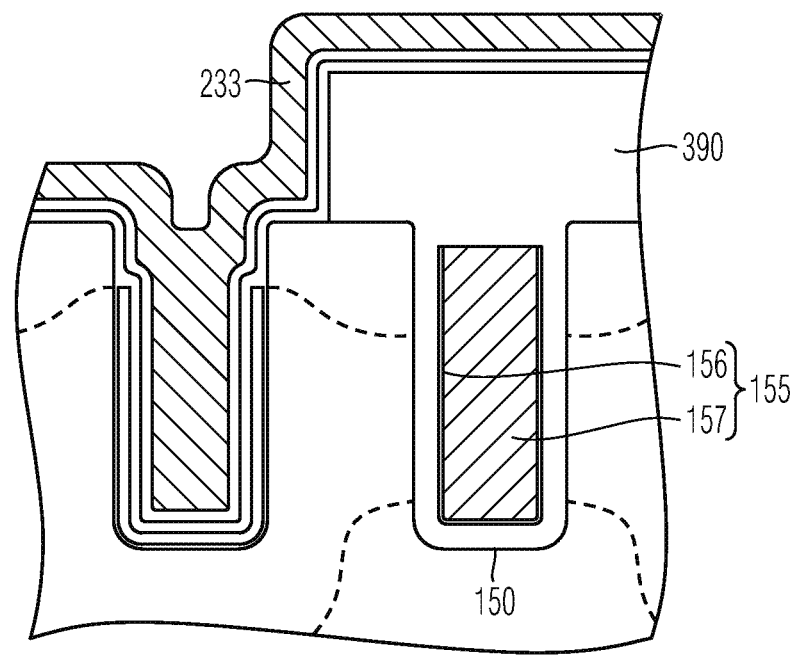
Figure 4Q:
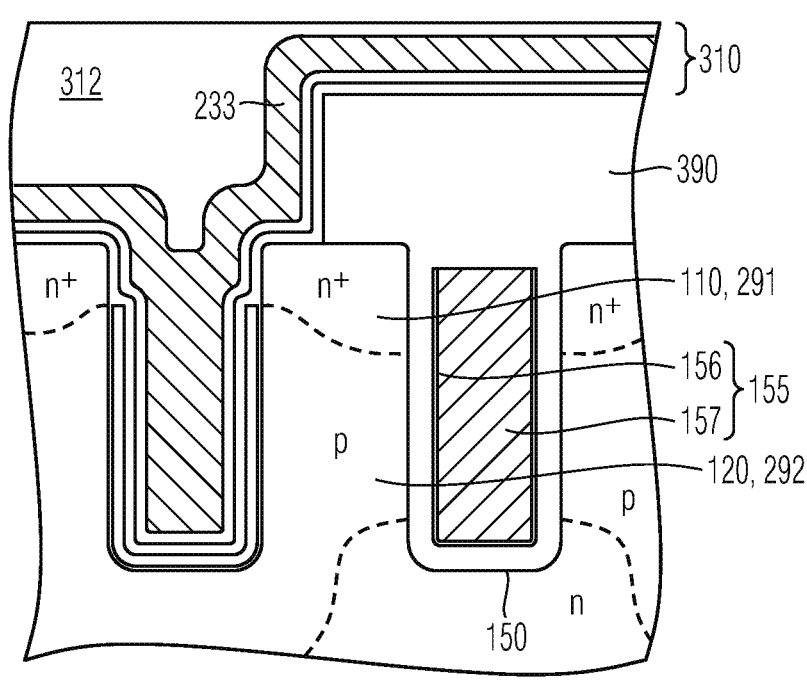

FIGS. 4A-4Q show a process for forming a silicon carbide device with trench gate electrodes and trench contacts.

A trench 209 for a contact (contact trench) and a gate trench 159 are formed in a silicon carbide body 100 with a process as described with reference to FIG. 1A. Prior to or after formation of the contact trench 209 and the gate trench 159, n type source regions 110, n type current spread regions 137 and p type regions 120 are formed in the silicon carbide body 100 by ion implantation.

A gate dielectric layer 152 is formed. Forming the gate dielectric layer 152 may include deposition of one or more dielectric materials and/or a thermal oxidation process.

FIG. 4A shows the gate dielectric layer 152 lining the contact trench 209 and the gate trench 159, and covering the first surface 101 of the silicon carbide body 100.

The gate trench 159 and the contact trench 209 are formed side-by-side. The dimensions of the gate trench 159 and the contact trench 209 may be different or the same, as illustrated. The gate dielectric layer 152 may include or consist of silicon oxide.

The source regions 110 extend from the first surface 101 into the silicon carbide body 100. The current spread regions 137 are formed below the gate trenches 159, wherein each gate trench 159 extends into a current spread region 137. The p type regions 120 separate the source regions 110 and the current spread regions 137. The contact trenches 209 extend through the source regions 110 into the p type region 120.

The source regions 110 embody first doped regions 291 as described with reference to the preceding figures. The p type regions 120 embody second doped regions 292 as described with reference to the preceding figures.

A thin barrier liner 156 may be deposited on the gate dielectric layer 152, e.g. by atomic layer deposition.

As illustrated in FIG. 4B, the barrier liner 156 may be highly conformal and covers the gate dielectric layer 152 with approximately uniform thickness. The thin barrier liner 156 may include or consist of titanium nitride TiN.

A highly conductive material 157 is deposited on the barrier liner 156. A portion of the highly conductive material 157 deposited outside the gate trench 159 and the contact trench 209 is removed, e.g. by a planarization process. The planarization process may include CMP (chemical mechanical polishing).

FIG. 4C shows the planarized highly conductive material 157 in the gate trench 159 and the contact trench 209. The conductive material 157 may be or may include highly doped polycrystalline silicon and/or tungsten W.

The conductive material is slightly recessed. The recess may include a wet etch process. A dielectric material 391 is deposited.

FIG. 4D illustrates the recessed conductive material 157 in the gate trench 159 and the contact trench 209 and the dielectric material 391 covering the gate trench 159 and the contact trench 209. The dielectric material 391 may include silicon oxide and/or a silicate.

The residual portion of the barrier liner 156 and the recessed conductive material 157 in the gate trench 159 form a gate electrode 155. A portion of the gate dielectric layer 152 separating the conductive material 157 from the silicon carbide body 100 forms a gate dielectric 151. The gate electrode 155 and the gate dielectric 151 form a trench gate structure 150.

An auxiliary mask material is deposited on the dielectric material 391 and patterned by photolithography to form an auxiliary mask 420 from the auxiliary mask material.

FIG. 4E shows an auxiliary mask 420 formed by a residual portion of the auxiliary mask material. The auxiliary mask 420 covers a first portion of the dielectric material 391 above the gate trenches 150. An opening 425 in the auxiliary mask 420 exposes a second portion of the dielectric material 391 above the contact trench 209.

An anisotropic masked etch process removes the exposed second portion of the dielectric material 391.

According to FIG. 4F, the etch process exposes a portion of the conductive material 157 and a portion of the gate dielectric layer 152 in the contact trench 209. A residual portion of the dielectric material 391 forms an interlayer dielectric 390.

Portions of the barrier liner 156, the conductive material 157, and the gate dielectric layer 152 in the contact trench 209 are completely removed as shown in FIG. 4G.

The auxiliary mask 420 is removed and a cleaning step removes residuals on sidewalls of the contact trench 209.

FIG. 4H shows the emptied and cleaned contact trench 209. Processing of the gate electrode 155 in the gate trench 159 is finished and the contact trench 209 is ready for formation of a contact structure as described in detail with reference to FIGS. 1A-1D, FIGS. 2A-2E, and FIGS. 3A-3B.

As illustrated in FIG. 4I, a first sublayer 214 covers the trench sidewalls of the contact trench 209, a collar portion 101-1 of the first surface 101 and the interlayer dielectric 390.

FIG. 4J shows a lower film 213 including the first sublayer 214 and a second sublayer 215 formed directly on the first sublayer 214.

FIG. 4K shows an etch mask 410 covering the first section 213-1 of the lower film 213 on a lower sidewall portion 202 of the contact trench 209 and exposing a second section 213-2 of the lower film 213 on an upper sidewall portion 201.

FIG. 4L shows a lower layer structure 210 formed from a residual portion of the lower film 213 after removal of the exposed second section 213-2 of the lower film 213.

FIG. 4M shows the lower layer structure 210 after removal of the etch mask 410 and a cleaning process.

FIG. 4N shows a third sublayer 224 formed on the lower layer structure 210, the upper sidewall portion 201, the collar portion 101-1 and the interlayer dielectric 390.

FIG. 4O shows an upper film 223 including the third sublayer 224 and a fourth sublayer 225 formed directly on the third sublayer 224.

A heat treatment forms a first interface layer 271 and second interface layer 272. The heat treatment may include a sequence of heat treatments at different temperatures.

Prior to or after the heat treatment, a tungsten layer 233 may be deposited to fill the contact trench 209. In some examples, the layer 233 may comprise at least one or more of Ti, TiN, AlCu or Cu in addition to or instead of tungsten.

According to FIG. 4P, the tungsten layer 233 is deposited with a sufficient layer thickness to fill completely the contact trench 209.

FIG. 4Q shows a power metal 312 formed on the tungsten layer 233. The power metal 312 may consist of or contain an aluminum copper alloy AlCu without silicon or an aluminum copper alloy AlSiCu containing silicon.

The methods described with reference to FIGS. 1A-1D, 2A-2E, 3A-3B and 4A-4Q may result in contact structures as described in the following FIGS. 5, 6, 7, 8, and 9. The contact structures described with reference to the following FIGS. 5, 6, 7, 8, and 9 may be formed using the methods described with reference to FIGS. 1A-1D, 2A-2E, 3A-3B and 4A-4Q.

Figure 5:
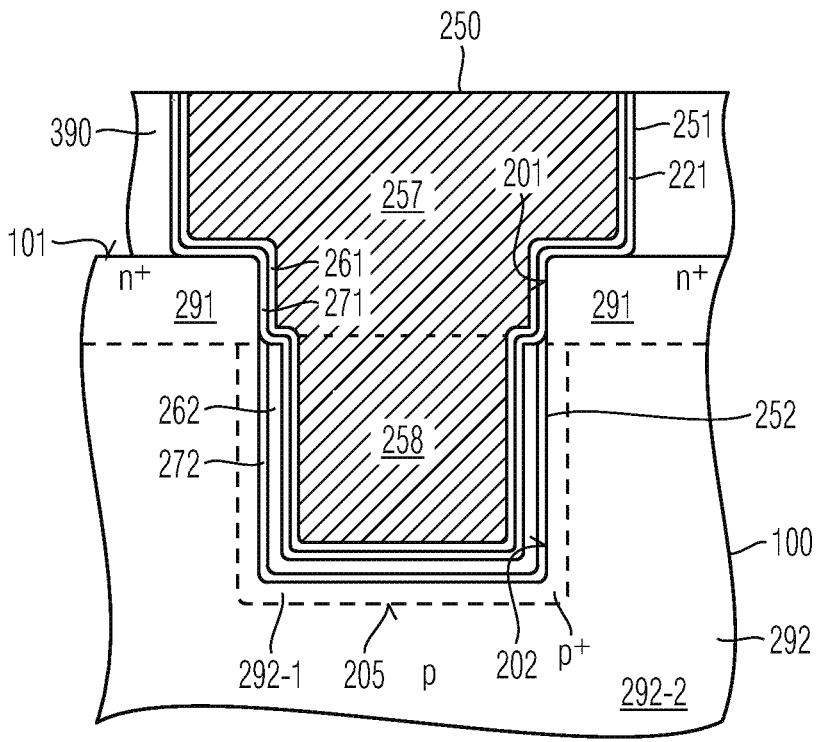
FIG. 5 shows a schematic vertical cross-sectional view of a portion of silicon carbide device with a contact structure including a first interface layer with a portion formed along an upper sidewall portion and with a second interface layer formed along a lower sidewall portion according to an embodiment.

FIG. 5 shows a contact structure 250 of a silicon carbide device with a silicon carbide body 100. An n type first doped region 291 and a p type second doped region 292 are formed in the silicon carbide 100, wherein the n type first doped region 291 extends from a first surface 101 of the silicon carbide body 100 down to the p type second doped region 292.

The silicon carbide device may be a SiC-TMOSFET (silicon carbide trench metal oxide semiconductor field effect transistor), wherein the n type first doped region 291 may be a source region and the p type second doped region 292 may include a body region of a transistor cell of the SiC-TMOSFET.

The n type first doped region 291 may contain nitrogen N as only dopant or may include further donor and/or acceptor atoms. The p type second doped region 292 may include a main portion 292-2 and a more heavily doped contact portion 292-1. The second doped region 292 may contain aluminum Al as only dopant or may include further acceptor and/or donor atoms.

The contact structure 250 includes an upper contact portion 251 in direct contact with the first doped region 291 and a lower contact portion 252 in direct contact with the contact portion 292-1 of the second doped region 292. The upper contact portion 251 may be formed in an opening of an interlayer dielectric 390 formed on the first surface 101.

The upper contact portion 251 includes a first interface layer 271, a first buffer layer 261, and an upper fill part 257. The first interface layer 271 is formed between the first buffer layer 261 and the silicon carbide body 100. The first buffer layer 261 is formed between the first interface layer 271 and the upper fill part 257.

The lower contact portion 252 includes a second interface layer 272, a second buffer layer 262, an unreacted portion of a first upper layer 221 and the first buffer layer 261. The second interface layer 272 is formed between the second buffer layer 262 and the silicon carbide body 100. The second buffer layer 262 is formed between the second interface layer 272 and the unreacted portion of the first upper layer 221 that is formed between the second buffer layer 262 and the first buffer layer 261. The first buffer layer 261 is formed between the unreacted portion of first upper layer 221 and the lower fill part 258.

The first interface layer 271 is in direct contact with the first doped region 291 and includes a first metal silicide/carbide, wherein the first metal silicide/carbide contains at least one binary phase of Me1 and Si in combination with at least one binary phase of Me1 and C and/or a ternary phase of Me1, Si, and C, with Me1 representing a first transition metal. The first transition metal may be nickel Ni or a first refractory metal. For example, the first refractory metal is titanium Ti or tantalum Ta. The first interface layer 271 may be a conformal structure of approximately uniform thickness. The thickness of the first interface layer 271 may be about 20 nm to 200 nm.

The first interface layer 271 and the first doped region 291 form a low-resistive first ohmic contact. The first interface layer 271 is free of elemental carbon or includes elemental carbon only to a very small degree. No elemental carbon or only very small quantities of elemental carbon are present at the interface between the first interface layer 271 and the silicon carbide body 100 and at the interface between the first interface layer 271 and the first buffer layer 261. In addition, no oxides and no nitrides or only low quantities of oxides and/or nitrides are formed along the interface between the first interface layer 271 and the first buffer layer 261.

The first transition metal incorporated into the first interface layer 271, and the first buffer layer 261 are sequentially deposited in an in-situ process. A heat treatment such as an RTP anneal converts at least a portion of the deposited first transition metal and a directly adjoining layer portion of the silicon carbide body 100 into the first transition metal silicide/carbide of the first interface layer 271.

The first buffer layer 261 is formed directly on the first interface layer 271 and contains a metal nitride, e.g. a nitride of the first refractory metal. The first buffer layer 261 may be an approximately conformal liner of uniform thickness. The thickness of the first buffer layer 261 may be about 30 nm to 200 nm.

The second interface layer 272 is in direct contact with the second doped region 292 and includes a second metal silicide/carbide, wherein the second metal silicide/carbide contains at least one binary phase of Me2 and Si in combination with at least one binary phase of Me2 and C and/or a ternary phase of Me2, Si, and C, with Me2 representing a second refractory metal. The second interface layer 272 may be a conformal structure of approximately uniform thickness. The thickness of the second interface layer 272 may be about 20 nm to 200 nm.

The first transition metal Me1 and the second refractory metal Me2 may be the same element or different elements. For example, the second refractory metal is titanium Ti or tantalum Ta.

The second interface layer 272 is formed along at least a lower sidewall portion 202 of a trench 209 that extends from a first surface 101 into the silicon carbide body 100.

The second interface layer 272 and the second doped region 292 form a low-resistive second ohmic contact. The second interface layer 272 is free of elemental carbon or includes elemental carbon only to a very small degree. No elemental carbon or only very small quantities of elemental carbon are present at the interface between the second interface layer 272 and the silicon carbide body 100 and at the interface between the second interface layer 272 and the second buffer layer 262. In addition, no oxides and no nitrides or only low quantities of oxides and/or nitrides are formed along the interface between the second interface layer 272 and the second buffer layer 262.

The second buffer layer 262 is formed directly on the second interface layer 272. The second buffer layer 262 may be a conformal liner of uniform thickness. The thickness of the second buffer layer 262 may be about 20 nm to 200 nm. The second buffer layer 262 contains an elemental metal, a metal compound and/or a metal alloy, wherein the metal may be a post-transition metal.

The metal incorporated into the second interface layer 272 and the second buffer layer 262 is sequentially deposited in an in-situ process. A heat treatment such as an RTP anneal converts at least a portion of the deposited second refractory metal and a directly adjoining layer portion of the silicon carbide body 100 into the second refractory metal silicide/carbide of the second interface layer 272.

The first upper layer 221 contains the unreacted portion of the first transition metal Me1 deposited on the second buffer layer 262 and along surfaces of an interlayer dielectric above the first surface 101.

The upper fill part 257 and the lower fill part 258 may contain an elemental metal, e.g. tungsten W, a metal alloy, and/or polycrystalline silicon.

Figure 6:
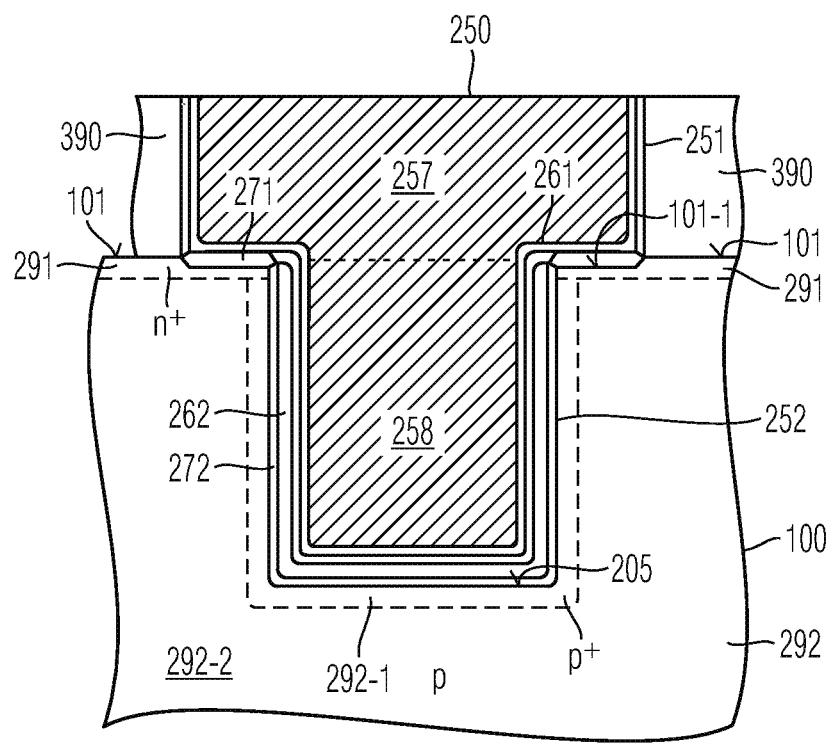
FIG. 6 shows a schematic vertical cross-sectional view of a portion of silicon carbide device with a contact structure according to an embodiment with a first interface layer formed on a horizontal first surface of a silicon carbide body.

FIG. 6 shows a contact structure 250 with the lower contact portion 252 extending from a plane coplanar with the first surface 101 down to the trench bottom 205. The second interface layer 272 is formed along the trench bottom 205 and along the trench sidewalls from the first surface 101 down to the trench bottom 205.

The upper contact portion 251 is formed completely above the first surface 101. The first interface layer 271 is formed exclusively along a collar portion 101-1 of the first surface 101 directly adjoining the contact opening in the first surface 101.

Figure 7:
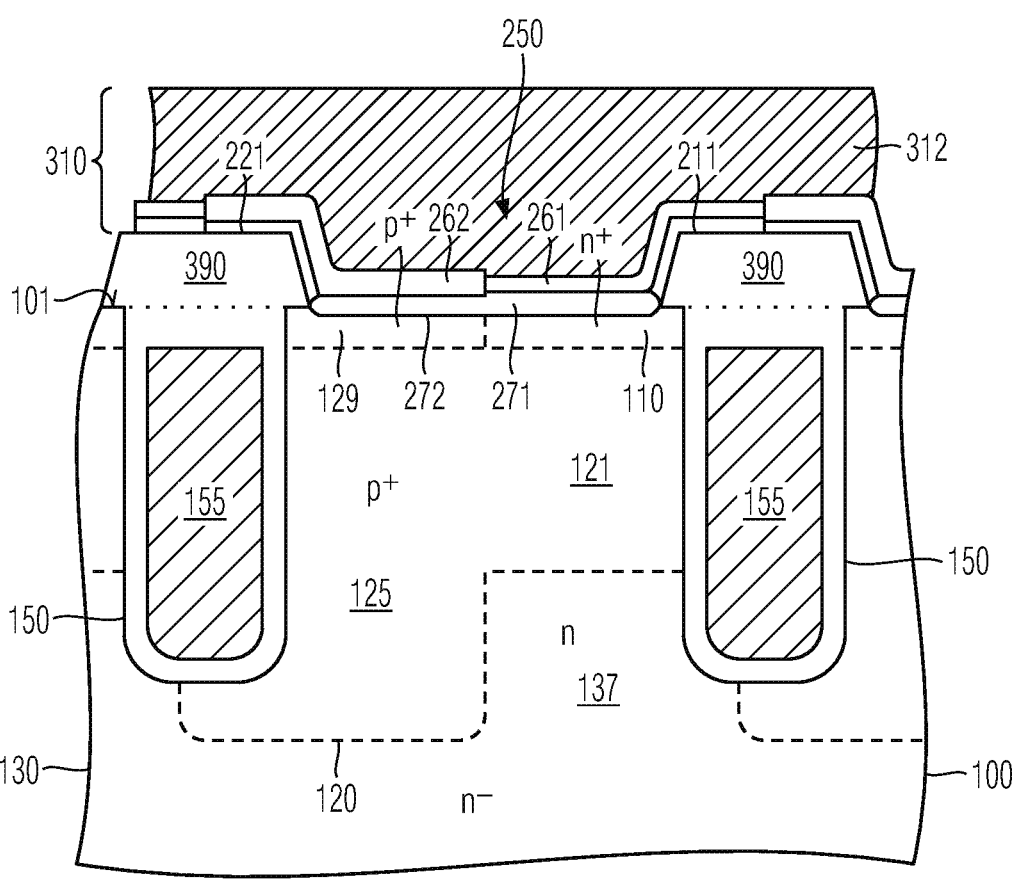
FIG. 7 shows a schematic vertical cross-sectional view of a portion of another silicon carbide device with a contact structure including first and second interface layers formed on a horizontal first surface of a silicon carbide body.

FIG. 7 shows a portion of a SiC-TMOSFET with trench gate structures 150 extending from a first surface 101 into a silicon carbide body 100. On an active sidewall of a trench gate structure 150, a body portion 121 of a p type region 120 separates an n type source region 110 and a current spread portion 137 of an n type drain/drift structure 130. On an opposite second sidewall of the trench gate structure 150, a shielding portion 125 of the p type region 120 extends down to the bottom and along a part of the bottom of the trench gate structure 150. The p type region 120 further includes a heavily p doped contact portion 129 formed along the first surface 101. The heavily p doped contact portion 129 and the n type source region 110 are formed side-by-side along the first surface 101. The source region 110 embodies an example of a first doped region 291 as described above. The contact portion 129 embodies an example of a second doped region 292 as described above.

Each trench gate structure 150 includes a conductive gate electrode 155. Sections of an interlayer dielectric 390 separate the gate electrodes 155 from a front side metallization 310.

The front side metallization 310 includes a first interface layer 271 formed directly on the source region 110 and a second interface layer 272 formed directly on the contact portion 129 of the p type region 120.

An unreacted residual of a first lower layer 211 may be formed on a portion of the interlayer dielectric 390 directly adjoining the source region 110. An unreacted residual of a first upper layer 221 may be formed on a portion of the interlayer dielectric 390 directly adjoining the contact region 129.

A first buffer layer 261 may be formed directly on the first interface layer 271 and the unreacted residual of the first lower layer 211. A second buffer layer 262 may be formed directly on the second interface layer 272 and the unreacted residual of the first upper layer 221.

The front side metallization 310 may further include a power metal 312 formed on the first and second buffer layers 261, 262.

Figure 8:
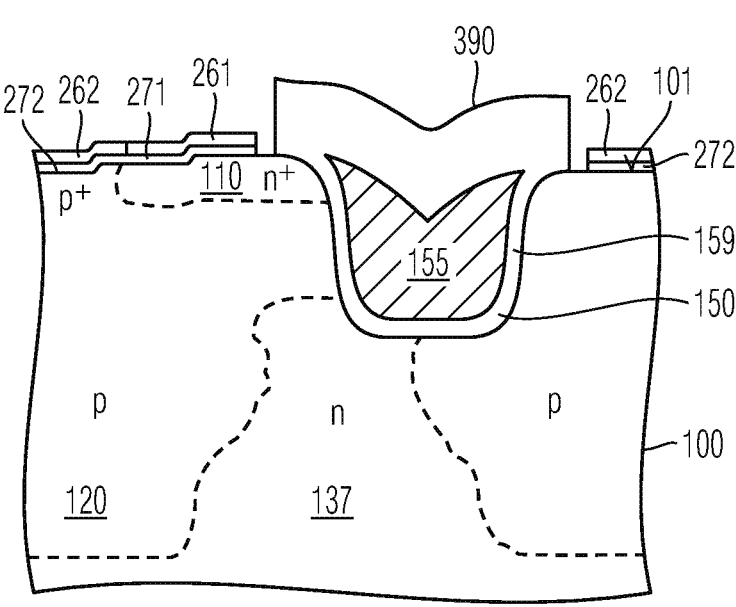
FIG. 8 shows a schematic vertical cross-sectional view of a portion of a MOSFET with trench gate electrodes and one-sided channel and with a contact structure including first and second interface layers formed on a horizontal first surface.

FIG. 8 shows a further SiC-TMOSFET with one-sided channel. A first interface layer 271 formed along the first surface 101 is in direct contact with a source region 110. A second interface layer 272 formed along the first surface 101 is in direct contact with a p type region 120. A first buffer layer 261 is formed on the first interface layer 271. A second buffer layer 262 is formed on the second interface layer 272.

Figure 9:
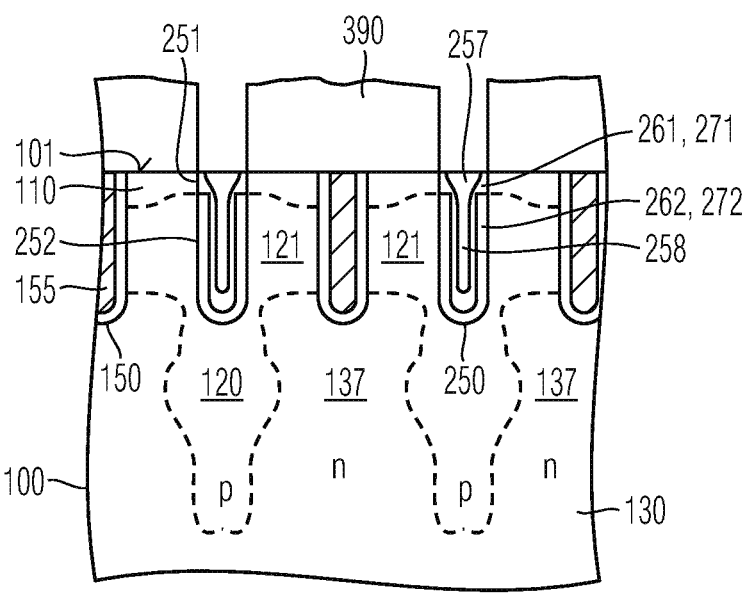
FIG. 9 shows a schematic vertical cross-sectional view of a portion of silicon carbide device with a contact structure including first and second interface layers formed in a contact trench according to an embodiment related to a MOSFET with trench gate electrodes and two-sided channel.

FIG. 9 illustrates a SiC-TMOSFET with two-sided channel. On both longitudinal sidewalls of trench gate structures 150, a body portion 121 of a p type region 120 separates an n type source region 110 and a current spread portion 137 of an n type drain/drift structure 130.

Between neighboring trench gate structures 150, contact structures 250 extend from the first surface 101 into the silicon carbide body 100.

Each contact structure 250 includes a lower contact portion 252 and an upper contact portion 251 between the first surface 101 and the lower contact portion 252.

The lower contact portion 252 includes a second interface layer 272 in contact with the two adjoining body regions 121, a second buffer layer 262 formed on the first interface layer 272, a non-reacted residual of the first upper layer on the second buffer layer 262, a first buffer layer on the unreacted residual of the first upper layer, and a lower fill part 258.

The upper contact portion 251 includes a first interface layer 271 in contact with the two adjoining source regions 110, a first buffer layer 261 on the first interface layer 271, and an upper fill part 257.

What is claimed is:

1. A method of manufacturing a semiconductor device, the method comprising:
   forming a trench extending from a first surface into a silicon carbide body;
   forming a first doped region and an oppositely doped second doped region in the silicon carbide body;
   forming a lower layer structure on a lower sidewall portion of the trench;
   forming an upper layer stack on an upper sidewall portion of the trench; and
   filling a space in the trench left by the lower layer structure and the upper layer stack with a fill part,
   wherein the first doped region and the upper layer stack are in direct contact along the upper sidewall portion,
   wherein the second doped region and the lower layer structure are in direct contact along the lower sidewall portion.

2. The method of claim 1, wherein the lower layer structure is further formed directly on a trench bottom of the trench.

3. The method of claim 1, wherein the upper layer stack is formed after forming the lower layer structure.

4. The method of claim 1, wherein forming the lower layer structure comprises:
   forming a lower film coating the lower sidewall portion and the upper sidewall portion;
   forming an etch mask covering a first section of the lower film on the lower sidewall portion and exposing a second section of the lower film on the upper sidewall portion; and
   selectively removing the second section of the lower film.

5. The method of claim 1, wherein forming the upper layer stack comprises:
   forming an upper film coating the upper sidewall portion and/or a collar portion of the first surface directly next to the trench.

6. The method of claim 1, wherein forming the lower layer structure comprises forming in-situ a first sublayer and forming a second sublayer on the first sublayer.

7. The method of claim 6, wherein the lower layer structure contains at least one of titanium and tantalum and further contains aluminum.

8. The method of claim 1, wherein forming the upper layer stack comprises forming in-situ a third sublayer and forming a fourth sublayer on the third sublayer.

9. The method of claim 8, wherein the third sublayer contains at least one first metal selected from the group consisting of titanium and tantalum, and wherein the fourth sublayer contains a second metal and/or a nitride of the first metal.

10. The method of claim 1, wherein a sublayer of the upper layer stack covers the lower layer structure.

11. The method of claim 1, wherein an end of the upper layer stack and an end of the lower layer structure abut one another along a sidewall of the trench.

12. The method of claim 1, wherein the upper layer stack extends onto the first surface.

13. A method of manufacturing a semiconductor device, the method comprising:
   forming a trench extending from a first surface into a silicon carbide body;
   forming a first doped region and an oppositely doped second doped region in the silicon carbide body;
   forming a lower layer structure that completely covers sidewalls of the trench;
   filling a space in the trench left by the lower layer structure with a first fill part; and
   forming an upper layer stack along a collar portion of the first surface directly next to the trench,
   wherein the upper layer stack covers the first fill part,
   wherein the first doped region and the upper layer stack are in direct contact along the first surface,
   wherein the second doped region and the lower layer structure are in direct contact along the sidewalls.

14. The method of claim 13, wherein forming the lower layer structure comprises:
   forming a first sublayer that covers the sidewalls of the trench;
   forming a second sublayer that covers the first sublayer, the first sublayer and the second sublayer forming a film; and
   removing a section of the film formed on the first surface, such that a residual portion of the film forms the lower layer structure that completely covers the sidewalls.

15. The method of claim 13, further comprising:
   forming a second fill part on the upper layer stack in an opening of an interlayer dielectric formed above the first fill part.

\* \* \* \* \*